US012622237B2

(12) United States Patent
Syue et al.

(10) Patent No.: US 12,622,237 B2
(45) Date of Patent: May 5, 2026

(54) TRENCH ISOLATION CONNECTORS FOR STACKED STRUCTURES

(71) Applicant: Taiwan Semiconductor Manufacturing Company, Ltd., Hsin-Chu (TW)

(72) Inventors: Wan-Jyun Syue, Hsinchu County (TW); Hsueh-Liang Chou, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 575 days.

(21) Appl. No.: 18/153,686

(22) Filed: Jan. 12, 2023

(65) Prior Publication Data

US 2023/0377949 A1 Nov. 23, 2023

Related U.S. Application Data

(60) Provisional application No. 63/377,281, filed on Sep. 27, 2022, provisional application No. 63/342,814, filed on May 17, 2022.

(51) Int. Cl.
H01L 21/762 (2006.01)
H01L 21/768 (2006.01)
(Continued)

(52) U.S. Cl.
CPC .. H01L 21/76283 (2013.01); H01L 21/76898 (2013.01); H01L 23/481 (2013.01);
(Continued)

(58) Field of Classification Search
CPC ......... H01L 21/76283; H01L 21/76898; H01L 23/481; H01L 23/5226; H01L 23/5283;
(Continued)

(56) References Cited

U.S. PATENT DOCUMENTS

2013/0200520 A1 8/2013 Nguyen
2015/0021785 A1* 1/2015 Lin ................... H01L 21/76897
438/459

(Continued)

FOREIGN PATENT DOCUMENTS

DE 102021110304 A1 7/2022
KR 20210157294 A 12/2021
WO 2019182657 A1 9/2019

*Primary Examiner* — Herve-Louis Y Assouman
(74) *Attorney, Agent, or Firm* — HAYNES AND BOONE, LLP

(57) ABSTRACT

Trench isolation connectors are disclosed herein for stacked semiconductor structures, and particularly, for stacked semiconductor structures having high voltage devices. An exemplary stacked device arrangement includes a first device substrate having a first device and a second device substrate having a second device. An isolation structure disposed in the second device substrate surrounds the second device. The isolation structure extends through the second device substrate from a first surface of the second device substrate to a second surface of the second device substrate. A conductive connector is disposed in the isolation structure. The conductive connector is connected to the second device and the first device. The conductive connector extends from the first surface of the second device substrate to the second surface of the second device substrate. The first device and the second device may be a first high voltage device and a second high voltage device, respectively.

20 Claims, 24 Drawing Sheets

(51) Int. Cl.

| | |
|---|---|
| *H01L 23/00* | (2006.01) |
| *H01L 23/48* | (2006.01) |
| *H01L 23/485* | (2006.01) |
| *H01L 23/522* | (2006.01) |
| *H01L 23/528* | (2006.01) |
| *H01L 23/535* | (2006.01) |
| *H01L 25/00* | (2006.01) |
| *H01L 25/065* | (2023.01) |
| *H01L 25/10* | (2006.01) |
| *H10D 84/85* | (2025.01) |

(52) U.S. Cl.

CPC ...... *H01L 23/5226* (2013.01); *H01L 23/5283* (2013.01); *H01L 24/08* (2013.01); *H01L 24/24* (2013.01); *H01L 24/80* (2013.01); *H01L 25/0652* (2013.01); *H01L 25/0657* (2013.01); *H01L 2224/08146* (2013.01); *H01L 2224/24146* (2013.01); *H01L 2224/80895* (2013.01); *H01L 2224/80896* (2013.01); *H01L 2225/06524* (2013.01); *H01L 2225/06544* (2013.01); *H01L 2924/141* (2013.01)

(58) Field of Classification Search

CPC ......... H01L 24/08; H01L 24/24; H01L 24/80; H01L 25/0652; H01L 25/0657; H01L 2224/08146; H01L 2224/24146; H01L 2224/80895; H01L 2224/80896; H01L 2225/06524; H01L 2225/06544; H01L 2924/141; H01L 23/485; H01L 2224/08145; H01L 23/535; H01L 2225/06541; H01L 2225/06548; H01L 25/50; H01L 25/105; H01L 2225/1047; H10D 84/856

See application file for complete search history.

(56) References Cited

U.S. PATENT DOCUMENTS

| | | | |
|---|---|---|---|
| 2015/0021789 A1 | 1/2015 | Lin | |
| 2018/0130836 A1* | 5/2018 | Chuang | H10F 39/811 |
| 2020/0161263 A1 | 5/2020 | Chen et al. | |
| 2021/0043575 A1* | 2/2021 | Lee | H01L 23/5385 |
| 2021/0043607 A1 | 2/2021 | Or-Bach et al. | |
| 2021/0082873 A1* | 3/2021 | Chen | H01L 24/00 |
| 2021/0375829 A1 | 12/2021 | Or-Bach et al. | |

* cited by examiner

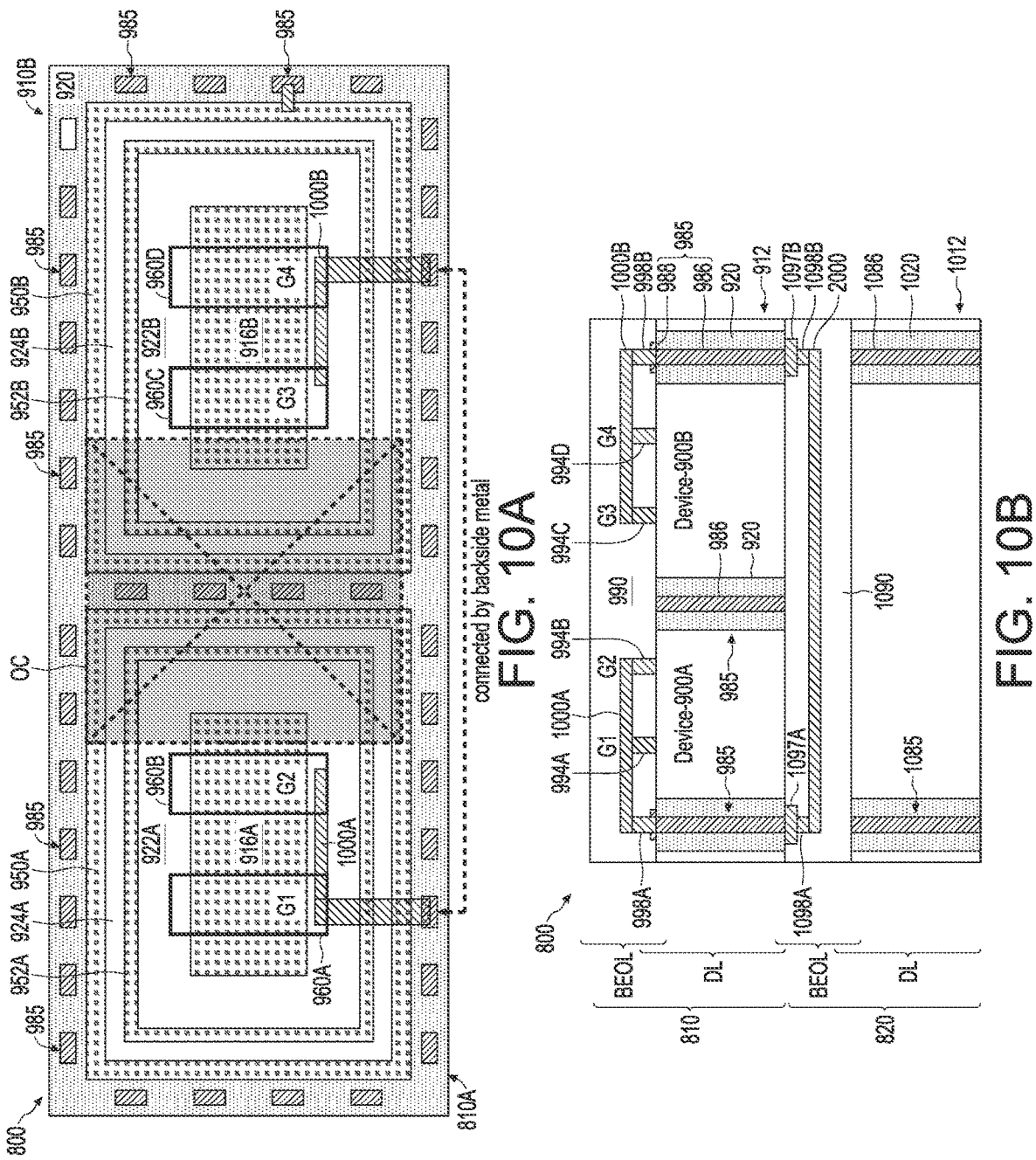

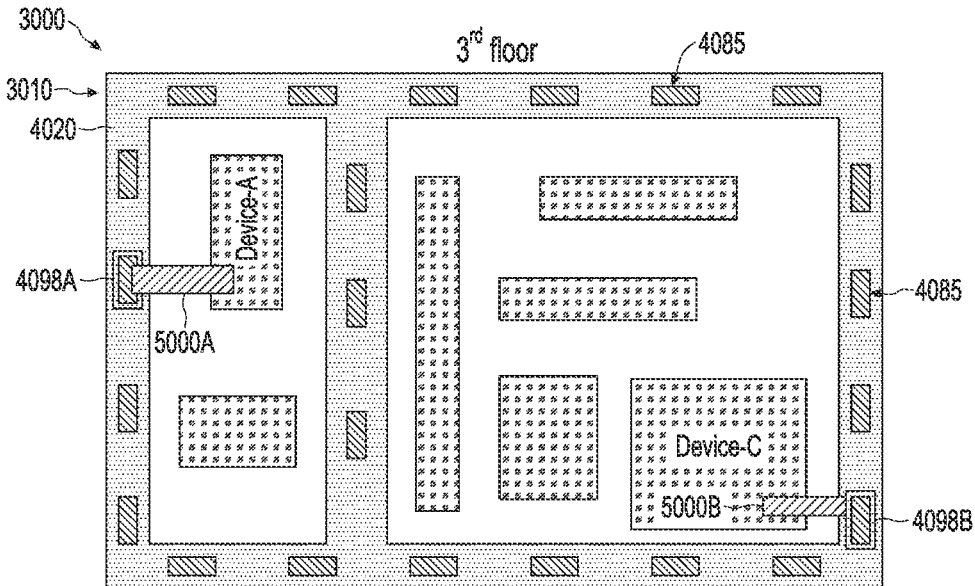
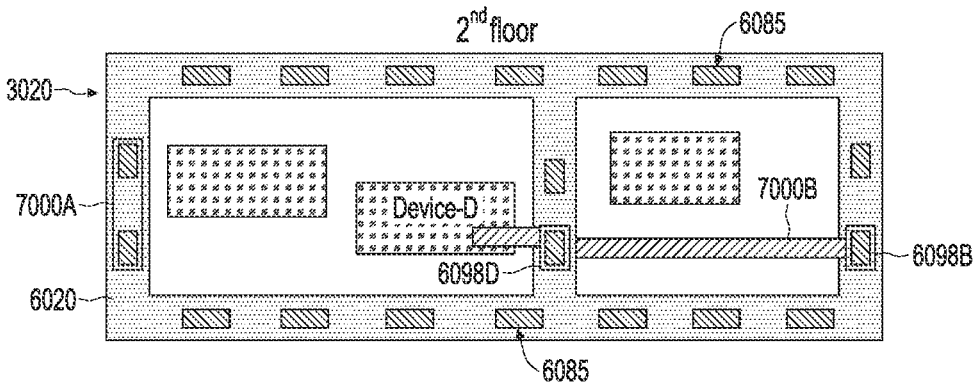
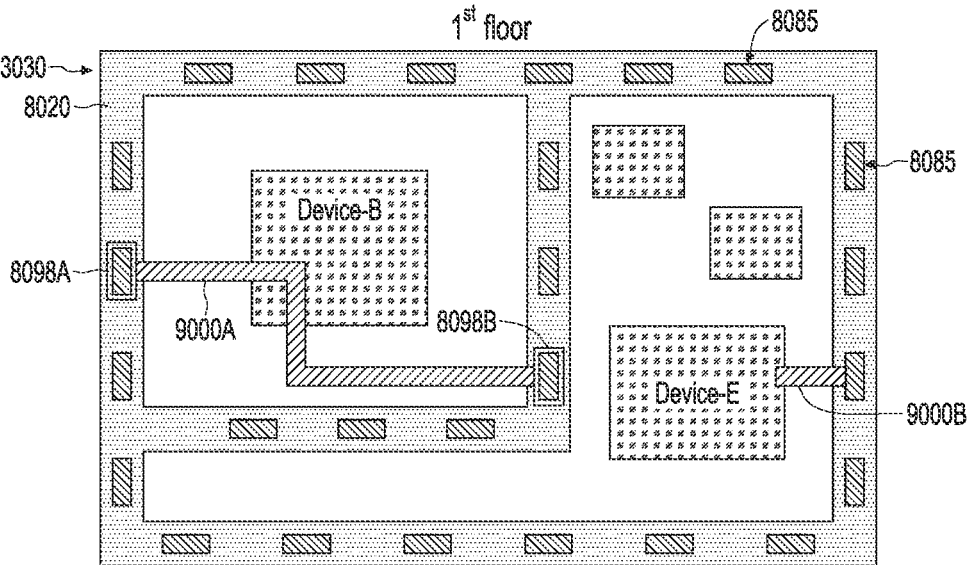
FIG. 11A

TRENCH ISOLATION CONNECTORS FOR STACKED STRUCTURES

This application is a non-provisional application of and claims benefit of U.S. Provisional Patent Application Ser. No. 63/342,814, filed May 17, 2022, and U.S. Provisional Patent Application Ser. No. 63/377,281, filed Sep. 27, 2022, the entire disclosures of which are incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, denser packing of ICs in advanced IC technology nodes call for denser interconnections between ICs. Although existing interconnection techniques have been generally adequate for their intended purposes, they have not been entirely satisfactory in all respects and improvements are needed as IC technologies scale.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 10A and FIG. 10B are diagrammatic views of another stacked device structure, in portion or entirety, according to various aspects of the present disclosure.

FIG. 11A and FIG. 11B are diagrammatic views of yet another stacked device structure, in portion or entirety, according to various aspects of the present disclosure.

DETAILED DESCRIPTION

Figures 1A, 1B:
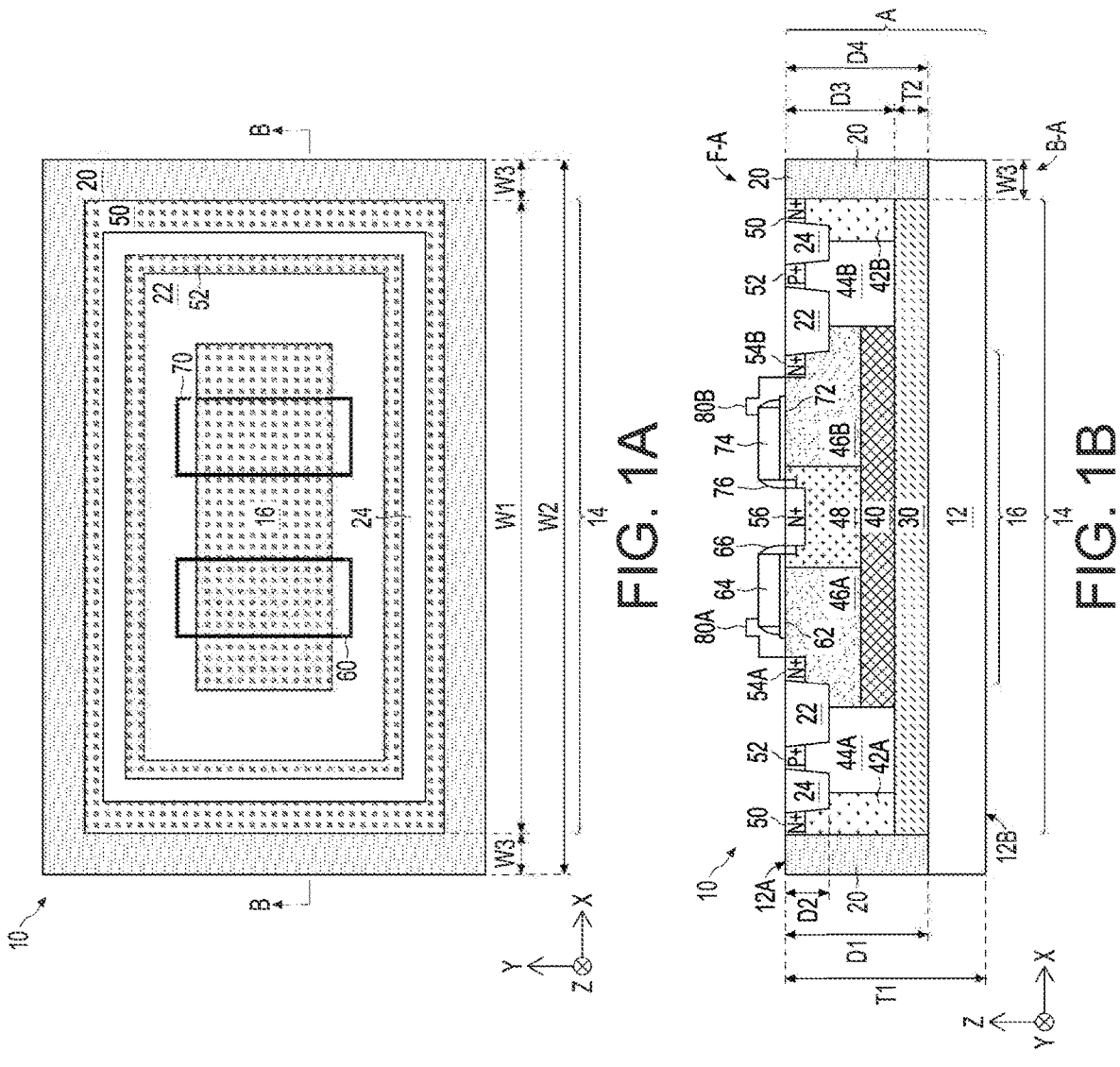
FIG. 1A, FIG. 1B, FIG. 2A, FIG. 2B, FIGS. 3A-3C, and FIGS. 4A-4C are various views of a device, in portion or entirety, according to various aspects of the present disclosure.

The present disclosure relates generally to integrated circuit (IC) devices and/or semiconductor devices, and more particularly, to interconnection structures for stacked semiconductor structures and methods of fabrication thereof.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, spatially relative terms, for example, "lower." "upper." "horizontal," "vertical," "above," "over," "below," "beneath," "up." "down." "top." "bottom," etc. as well as derivatives thereof (e.g., "horizontally," "downwardly." "upwardly." etc.) are used for ease of the present disclosure of one features relationship to another feature. The spatially relative terms are intended to cover different orientations of the device including the features. Furthermore, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/−10% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Trench isolation connectors are disclosed herein that electrically connect stacked structures, such as wafers, integrated circuit (IC) chips, IC dies, substrates, devices thereof, or combinations thereof. An exemplary trench isolation connector is a conductive structure disposed in a trench isolation structure of a device substrate of a wafer. The trench isolation structure encloses, bounds, surrounds, or combinations thereof the device of the device substrate. The trench isolation structure and the conductive structure disposed therein extend entirely through the device substrate, for example, from a top surface of the device substrate (over which one or more devices are formed) to a bottom surface of the device substrate. The trench isolation structure can be a shallow trench isolation (STI) structure, a deep trench isolation (DTI), other suitable isolation structure, or combinations thereof. The conductive structure includes an electrically conductive material. In some embodiments, multiple conductive structures are disposed in the trench isolation structure and isolated from one another (i.e., independent trench isolation connectors), such that the trench isolation connectors can facilitate various, flexible backside connections between devices of the device substrate and/or devices of other wafers.

Trench isolation connectors disclosed herein provide more compact interconnections between devices and/or wafers. High voltage devices can especially benefit from trench isolation connectors described herein. For example, interconnect structures that often connect high voltage devices on a single wafer have been observed to occupy a greater than desirable space and/or area as IC technology nodes scale. By stacking high voltage devices as described herein and/or interconnecting high voltage devices using the disclosed trench isolation connectors, an area and/or a space occupied by interconnected high voltage devices is significantly reduced. For example, stacked device structures that stack and interconnect two high voltage devices as disclosed herein can reduce device area by as much as 50%. In another example, stacked device structures that stack and interconnect three high voltage devices as disclosed herein can reduce device area by as much as 66%. Further, backside interconnect (routing) structures that include the disclosed trench isolation connectors can significantly increase routing flexibility when interconnecting devices, decrease an area consumed by interconnected devices, improve area efficiency of interconnected devices, etc. Trench isolation connectors disclosed herein can also provide silicon-on-insulator like isolation between devices and/or wafers, which can reduce electrical leakage paths. Different embodiments may have different advantages, and no particular advantage is required of any embodiment.

FIG. 1A, FIG. 2A, FIG. 3A, and FIG. 4A are fragmentary top views of a device 10, in portion or entirety, according to various aspects of the present disclosure. FIG. 1B, FIG. 2B, FIG. 3B, and FIG. 4B are fragmentary cross-sectional views of device 10 taken along line B-B of FIG. 1A, FIG. 2A, FIG. 3A, and FIG. 4A, respectively, in portion or entirety, according to various aspects of the present disclosure. FIG. 3C and FIG. 4C are fragmentary cross-sectional views of device 10 taken along line C-C of FIG. 3A and FIG. 4A, respectively, in portion or entirety, according to various aspects of the present disclosure. Device 10 forms a portion or an entirety of a wafer A, which has a frontside F-A and a backside B-A. In the depicted embodiments, device 10 is fabricated at frontside F-A of wafer A, and device 10 includes a substrate 12, a device region 14, and an active (OD) region 16. A deep trench isolation (DTI) structure 20, a shallow trench isolation (STI) structure 22, and an STI structure 24 are disposed in substrate 12. DTI structure 20 separates and/or electrically isolates device region 14, for example, from other device regions. STI structure 22 separates and/or electrically isolates active region 16, for example, from other regions and/or device features of device region 14. STI structure 24 separates and/or electrically isolates device features, for example, from other device features. In the depicted embodiments, active region 16 is configured for a transistor and can be referred to as a transistor region. In some embodiments, active region 16 includes a high voltage device, such as a high voltage transistor. High voltage devices operate at high voltages, where voltage ranges considered "high voltage" depends on technology node. For example, 7 nm node devices operating at voltages greater than about 1.8 V may be considered high voltage devices, while 0.18 μm node devices operating at voltages greater than about 6 V may be considered high voltage devices (and 0.18 μm technology node devices operating at voltages of about 1.8 V may be considered low voltage devices). FIGS. 1A-4A, FIGS. 1B-4B, FIG. 3C, and FIG. 4C have been simplified for the sake of clarity to better understand the inventive concepts of the present disclosure. Additional features can be added in device 10, and some of the features described below can be replaced, modified, or eliminated in other embodiments of device 10.

Turning to FIG. 1A and FIG. 1B, substrate 12 includes an elementary semiconductor, such as silicon and/or germanium; a compound semiconductor, such as silicon carbide, gallium arsenide, gallium phosphide, indium phosphide, indium arsenide, indium antimonide, or combinations thereof; an alloy semiconductor, such as SiGe, GaAsP, AlInAs, AlGaAs, GaInAs, GaInP, GaInAsP, or combinations thereof; or combinations thereof. In some embodiments, substrate 12 is a semiconductor-on-insulator substrate, such as a silicon-on-insulator substrate, a silicon germanium-on-insulator substrate, or a germanium-on-insulator substrate. Substrate 12 has a thickness T1. Thickness T1 may be along the z-direction between a surface 12A of substrate 12 and a surface 12B of substrate 12. Surface 12A and surface 12B provide frontside F-A and backside B-A, respectively, of wafer A. In some embodiments, surface 12A and surface 12B are a top surface and a bottom surface, respectively, of substrate 12. In some embodiments, surface 12A and surface 12B are a frontside and a backside, respectively, of substrate 12.

Substrate 12 can be doped with p-type dopants and/or n-type dopants. In the depicted embodiment, substrate 12 is a silicon substrate doped with p-type dopants and may be referred to as a p-type substrate hereinafter. P-type dopants include boron, indium, gallium, other p-type dopants, or combinations thereof. N-type dopants include phosphorus, arsenic, antimony, other n-type dopants, or combinations thereof. Because the depicted embodiment includes a p-type doped substrate, doping configurations of device 10 described below are consistent with a p-type doped substrate. Device 10 may alternatively include an n-type doped substrate, in which case, the doping configurations described below should be read consistent with an n-type doped substrate (for example, read with doping configurations having an opposite conductivity). The present disclosure contemplates any doping configuration of substrate 12, doped regions therein, and/or doped wells therein that are configured to provide a transistor, such as a high voltage transistor, and/or other device that can benefit from backside trench isolation connections.

From a top view (FIG. 1A), DTI structure 20 surrounds device region 14, STI structure 22 surrounds active region 16, and STI structure 24 surrounds at least one device feature in device region 14. STI structure 24 is between DTI structure 20 and STI structure 22. In the depicted embodiment, DTI structure 20, STI structure 22, and STI structure 24 are rectangular rings that extend continuously around their respective regions and/or respective features of device 10. DTI structure 20, STI structure 22, and STI structure 24 can thus be referred to as rectangular-shaped isolation rings. STI structure 22 and STI structure 24 are bounded by DTI structure 20, and STI structure 22 is bounded by STI structure 24. DTI structure 20, STI structure 22, STI structure 24, or combinations thereof can have other top profiles. For example, DTI structure 20, STI structure 22, STI structure 24, or combinations thereof may be a square ring, an oval ring, a circular ring, a hexagonal ring, an octagonal ring, or other suitable shaped ring. In some embodiments, DTI structure 20, STI structure 22, STI structure 24, or combinations thereof is discontinuous (e.g., discrete isolation segments are arranged and combined to provide an isolation ring around a region and/or a feature).

DTI structure 20 has a width W1 (e.g., along the x-direction) that corresponds with its inner width (i.e., a width of an inner ring formed by DTI structure 20), a width W2 (e.g., along the x-direction) that corresponds with its outer width (i.e., a width of an outer ring formed by DTI structure 20), and a width W3 (e.g., along the x-direction) that corresponds with a width and/or thickness of DTI structure 20. Width W2 is greater than width W1. Width W3 is given by a difference between width W2 and width W divided by two (i.e., width W3=(width W2–width W1)/2). Width W1 corresponds with a width along the x-direction of device region 14.

Depths of STI structures are less than depths of DTI structures. For example, DTI structure 20 has a depth D1 into substrate 12, STI structure 22 and STI structure 24 have a depth D2 into substrate 12, and depth D1 is greater than depth D2. Depth D1 is less than thickness T1 of substrate 12. In some embodiments, depth D1 is about 1 μm to about 3 μm, and depth D2 is less than 1 μm. Depth D1 may be along the z-direction between a surface 12A of substrate 12 and a bottom surface of DTI structure 20. Depth D2 may be along the z-direction between surface 12A of substrate 12 and a bottom surface of STI structure 22 and/or a bottom surface of STI structure 24. In FIG. 1B, STI structure 22 and STI structure 24 have the same depth. In some embodiments, a depth of STI structure 22 is different than a depth of STI structure 24, and the depth of STI structure 22 and the depth of STI structure 24 are less than depth D1. In some embodiments, DTI structure 20 is a high aspect ratio isolation structure, which generally refers to an isolation structure having one dimension (e.g., depth D1) that is substantially greater than another dimension (e.g., width W3). For example, a ratio of depth D1 to width W3 is greater than about 5, while a ratio of depth D2 to widths of STI structures 22, 24 is less than 5. Since dimensions of DTI structure 20 and STI structures 22, 24 can vary based on technology node, the present disclosure contemplates other ratios of depth D1 to width W3 and/or ratios of depth D2 to widths of STI structures 22, 24 that can benefit from the configurations described herein, along with DTI structures having ratios of depth D1 to width W3 that are less than 5.

DTI structure 20, STI structure 22, and STI structure 24 include silicon oxide, silicon nitride, silicon oxynitride, other suitable isolation material (including, for example, silicon, oxygen, nitrogen, carbon, other suitable isolation constituent, or combinations thereof), or combinations thereof. In some embodiments, DTI structure 20, STI structure 22, STI structure 24, or combinations thereof are oxide layers. In some embodiments, DTI structure 20, STI structure 22, STI structure 24, or combinations thereof have a multilayer structure, such as a bulk dielectric layer over a dielectric liner. For example, DTI structure 20, STI structure 22, STI structure 24, or combinations thereof include an oxide layer over a silicon nitride liner. In another example, DTI structure 20, STI structure 22, STI structure 24, or combinations thereof include a dielectric layer (e.g., an oxide layer) over a doped liner, such as boron silicate glass (BSG) liner and/or a phosphosilicate glass (PSG) liner. In yet another example, DTI structure 20, STI structure 22, STI structure 24, or combinations thereof include a polysilicon layer and an oxide layer, where the oxide layer is between the polysilicon layer and substrate 12.

A buried layer 30 is disposed a depth D3 in substrate 12. Depth D3 may be along the z-direction between surface 12A of substrate 12 and a top surface of buried layer 30. Buried layer 30 extends from depth D3 to a depth D4 in substrate 12. Depth D4 may be along the z-direction between surface 12A of substrate 12 and a bottom surface of buried layer 30. A thickness T2 of buried layer 30 may be along the z-direction between the top surface and the bottom surface of buried layer 30 (e.g., thickness T2=depth D4–depth D3). Buried layer 30 is an n-type buried layer (NBL) (e.g., an n-type semiconductor layer and/or an n-doped portion of substrate 12), a p-type buried layer (PBL) (e.g., a p-type semiconductor layer and/or a p-doped portion of substrate 12), a buried dielectric layer (e.g., a buried oxide (BOX) layer), or combinations thereof. In some embodiments, buried layer 30 has a multilayer structure. For purposes of the depicted embodiment, buried layer 30 is an NBL.

Buried layer 30 has a width (e.g., along an x-direction) that is equal to width W1, such that buried layer 30 spans a width of device region 14. In some embodiments, STI structure 22 and STI structure 24 have depths that are less than depth D3 (i.e., depth D2<depth D3), while DTI structure 20 has a depth that is greater than or equal to depth D3 (i.e., depth D1≥depth D3). In FIG. 1B, depth D1 is equal to depth D4. In other words, the bottom surface of DTI structure 20 and the bottom surface of buried layer 30 are at the same depth in substrate 12. In some embodiments, the bottom surface of DTI structure 20 and the bottom surface of buried layer 30 form a substantially planar surface. In some embodiments, the bottom surface of DTI structure 20 is substantially coplanar with the bottom surface of buried layer 30.

Various doped regions are disposed in substrate 12, such as a deep p-well (DPW) 40, an n-well 42A, an n-well 42B, a p-well 44A, a p-well 44B, an n-well 46A, an n-well 46B, a p-well 48, an n-doped region 50, a p-doped region 52, an n-doped region 54A, an n-doped region 54B, and an n-doped region 56. DPW 40, p-well 44A, p-well 44B, p-well 48, and p-doped region 52 are doped with p-type dopants. N-well 42A, n-well 42B, n-well 46A, n-well 46B, n-doped region 50, n-doped region 54A, n-doped region 54B, and n-doped region 56 are doped with n-type dopants. P-doped regions/ wells and n-doped regions/wells of device 10 may be doped with the same or different p-type dopants and n-type dopants, respectively. DPW 40, n-well 42A, n-well 42B, p-well 44A, p-well 44B, n-well 46A, n-well 46B, p-well 48, n-doped region 50, p-doped region 52, n-doped region 54A, n-doped region 54B, and n-doped region 56 have dopant concentrations that are consistent with and/or facilitate operation of a high voltage transistor. In some embodiments, one or more of the various doped regions are doped portions of substrate 12. In some embodiments, one or more of the various doped regions are doped semiconductor layers disposed in substrate 12, such as an n-doped silicon germanium layer and/or a p-doped silicon germanium layer disposed in p-type silicon substrate 12.

DPW 40 (also referred to as a PBL) is on buried layer 30 and has a width (e.g., along an x-direction) that is greater than or equal to a width (e.g., along the x-direction) of active region 16. N-well 42A and n-well 42B are on buried layer 30 and adjacent to DTI structure 20. N-well 42A is between p-well 44A and DTI structure 20, and n-well 42B is between p-well 44B and DTI structure 20. A portion of n-well 42A is between DTI structure 20 and STI structure 24, and n-well 42A extends along the y-direction from n-doped region 50 to buried layer 30. A portion of n-well 42B is between DTI structure 20 and STI structure 24, and n-well 42B extends along the y-direction from n-doped region 50 to buried layer 30. In some embodiments, n-well 42A and n-well 42B are portions of an n-well ring adjacent to DTI structure 20.

P-well 44A and p-well 44B are between DPW 40 and n-well 42A and n-well 42B, respectively. P-well 44A is between n-well 42A and n-well 46A, and p-well 44B is between n-well 42B and n-well 46B. A portion of p-well 44A and a portion of p-well 44B is between STI structure 22 and STI structure 24. P-well 44A and p-well 44B extend along the y-direction from p-doped region 52 to buried layer 30. In some embodiments, p-well 44A and p-well 44B are portions of a p-well ring adjacent to an n-well ring (e.g., formed by n-well 42A and n-well 42B). An interface between p-well 44A and n-well 42A is below STI structure 24, an interface between p-well 44B and n-well 42B is below STI structure 24, an interface between p-well 44A and DPW 40 is below STI structure 22, an interface between p-well 44A and n-well 46A is below STI structure 22, an interface between p-well 44B and DPW 40 is below STI structure 22, and an interface between p-well 44B and n-well 46B are below STI structure 22.

N-well 46A, n-well 46B, and p-well 48 are on DPW 40. N-well 46A and n-well 46B are between p-well 48 and p-well 44A and p-well 44B, respectively. N-well 46A and n-well 46B are between p-well 48 and STI structure 22. N-well 46A, n-well 46B, and p-well 48 extend along the y-direction from surface 12A of substrate 12 to DPW 40. N-well 46A and n-well 46B may be drift diffusion regions (e.g., NDD regions). In some embodiments, DPW 40 is co-implanted with drift diffusion regions, such as NDD regions (e.g., n-well 46A and n-well 46B). In some embodiments, DPW 40, n-well 46A, n-well 46B, other doped regions of substrate 12, or combinations thereof are co-implanted with impurities, such as nitrogen, carbon, fluorine, other impurities, or combinations thereof, which can inhibit dopant diffusion.

N-doped region 50 is in n-well 42A and n-well 42B. N-doped region 50 is between DTI structure 20 and STI structure 24, and in the top view (FIG. 1A), n-doped region 50 is a rectangular-shaped ring. A dopant concentration of n-doped region 50 is greater than a dopant concentration of n-well 42A and n-well 42B, and thus, n-doped region 50 is designated as an N+ region. In some embodiments, n-doped region 50 is an n-type guard ring, which may facilitate application of an electrical bias to substrate 12 (for example, via n-doped region 50, n-doped wells (e.g., n-doped well 42A and n-doped well 42B), and buried layer 30) and/or improve electrical isolation of a high voltage transistor of active region 16 of device 10.

P-doped region 52 is in p-well 44A and p-well 44B. P-doped region 52 is between STI structure 24 and STI structure 22, and in the top view (FIG. 1A), p-doped region 52 is a rectangular-shaped ring. A dopant concentration of p-doped region 52 is greater than a dopant concentration of p-well 44A and p-well 44B, and thus, p-doped region 52 is designated as a P+ region. In some embodiments, p-doped region 52 is a p-type guard ring, which may facilitate application of an electrical bias to substrate 12 (for example, via p-doped region 52, p-doped wells (e.g., p-doped well 44A and p-doped well 44B), and buried layer 30) and/or improve electrical isolation of a high voltage transistor of active region 16 of device 10.

N-doped region 54A is in n-well 46A, n-doped region 54B is in n-well 46B, and n-doped region 56 is in p-well 48. N-doped region 54A and n-doped region 54B are adjacent to STI structure 22. In some embodiments, n-doped region 54A and n-doped region 54B are source regions of device 10, and n-doped region 56 is a drain region of device 10. In such embodiments, n-doped region 54A and n-doped region 54B can be referred to as source 54A and source 54B, and n-doped region 56 can be referred to as drain 56.

A gate structure 60 and a gate structure 70 are disposed over substrate 12 in active region 14. Gate structure 60 is between source 54A and drain 56, and gate structure 70 is between source 54B and drain 56. Gate structure 60 includes a gate stack (e.g., a gate dielectric 62 and a gate electrode 64) and gate spacers 66 disposed along sidewalls of the gate stack. Gate structure 70 includes a gate stack (e.g., a gate dielectric 72 and a gate electrode 74) and gate spacers 76 disposed along sidewalls of the gate stack. Gate structure 60 and/or gate structure 70 can form a portion of a transistor. In some embodiments, a high voltage transistor includes gate structure 60 disposed between source 54A and drain 56, where a channel region is in substrate 12 between source 54A and drain 56 and gate structure 60 engages the channel region, such that current can flow between source 54A and drain 56. In some embodiments, a high voltage transistor includes gate structure 70 disposed between source 54B and drain 56, where a channel region is in substrate 12 between source 54B and drain 56 and gate structure 70 engages the channel region, such that current can flow between source 54B and drain 56.

Gate dielectric 62 and gate dielectric 72 can include a dielectric material, such as silicon oxide, high-k dielectric material, other suitable dielectric material, or combinations thereof. Examples of high-k dielectric material include $HfO_2$, HfSiO, $HfSiO_4$, HfSiON, HfLaO, HfTaO, HfTiO, HfZrO, HfAlO, ZrO, $ZrO_2$, $ZrSiO_2$, AlO, AlSiO, $Al_2O_3$, TIO, $TiO_2$, LaO, LaSiO, $Ta_2O_3$, $Ta_2O_5$, $Y_2O_3$, $SrTiO_3$, BaZrO, $BaTiO_3$ (BTO), (BaSr) $TiO_3$ (BST), $Si_3N_4$, hafnium dioxide-alumina ($HfO_2$—$Al_2O_3$) alloy, other suitable high-k dielectric material, or combinations thereof. In some embodiments, gate dielectric 62 and gate dielectric 72 include the same materials and/or the same configurations (e.g., same number and/or same configuration of layers). In some embodiments, gate dielectric 62 and gate dielectric 72 include different materials and/or different configurations.

Gate electrode 64 and gate electrode 74 can include a conductive material, such as polysilicon, Al, Cu, Ti, Ta, W, Mo, Co, TaN, NiSi, CoSi, TiN, WN, TiAl, TiAlN, TaCN, TaC, TaSiN, other conductive material, or combinations thereof. In some embodiments, gate electrode 74 can include a dielectric material. In some embodiments, gate electrode 64 and gate electrode 74 include the same materials and/or the same configurations (e.g., same number and/or same configuration of layers). In some embodiments, gate electrode 64 and gate electrode 74 include different materials and/or different configurations. For example, gate electrode 64 includes one or more metal layers over gate dielectric 62, while gate electrode 74 includes a polysilicon layer and/or a dielectric layer.

A resist protective oxide (RPO) 80A is disposed over gate structure 60 and n-well 46A, and an RPO 80B is disposed over gate structure 70. RPO 80A covers a portion of n-well 46A not covered by a respective gate spacer 66, and RPO 80B covers a portion of n-well 46B not covered by a respective gate spacer 76. RPO 80A extends from source 54A and covers the portion of n-well 46A, a sidewall of gate dielectric 62, the respective gate spacer 66, and a portion of gate electrode 64. RPO 80B extends from source 54B and covers the portion of n-well 46B, a sidewall of gate dielectric 72, the respective gate spacer 76, and a portion of gate electrode 76. RPO 80A and RPO 80B may function as silicide blocking layers during subsequent silicidation processes. For example, when contacts are formed to source 54A and source 54B. RPO 80A and RPO 80B may block silicide layers formed on source 54A and source 54B from forming on n-well 46A and n-well 46B, respectively.

Figures 2A, 2B:
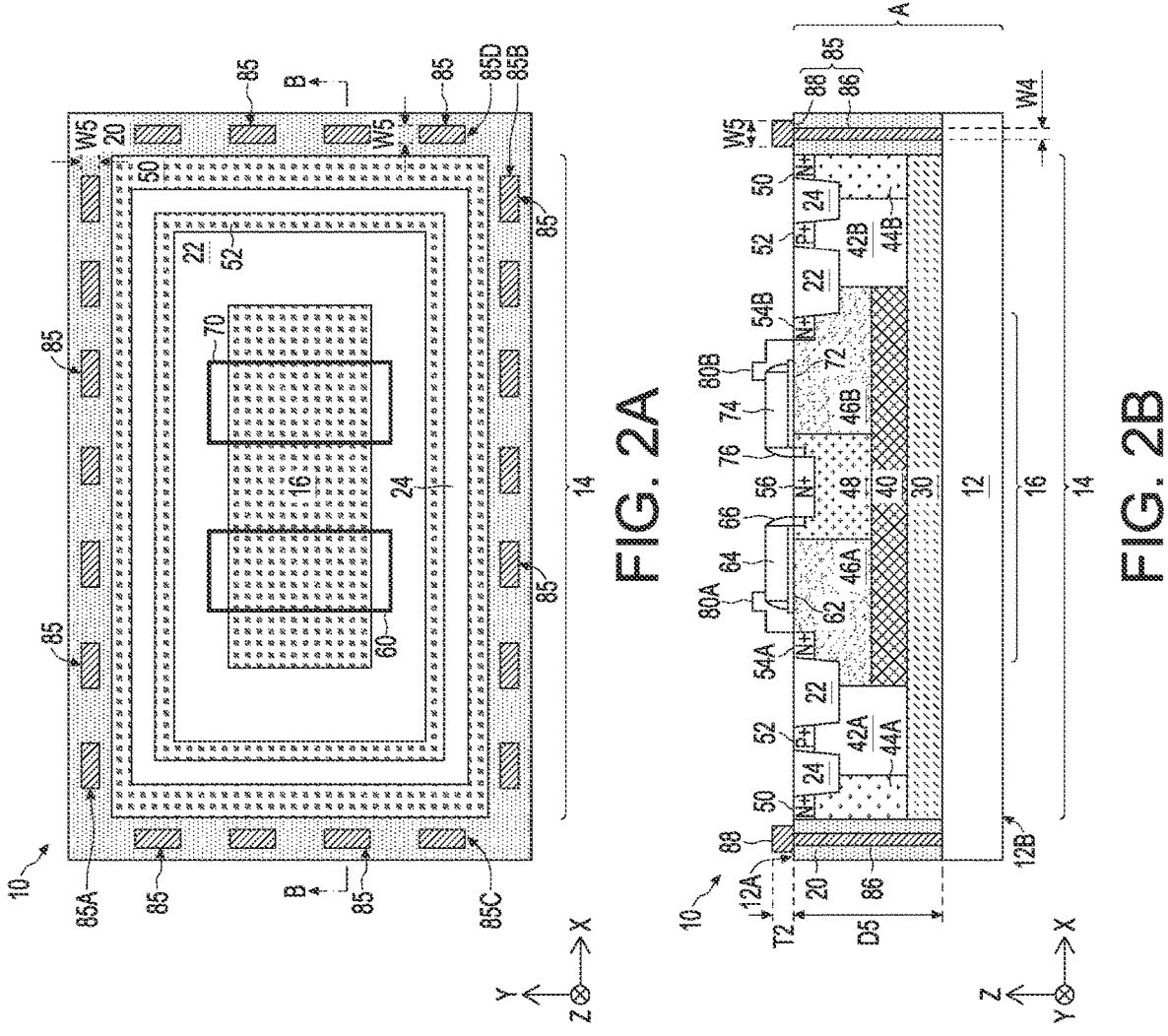

Turning to FIG. 2A and FIG. 2B, device 10 includes trench isolation connectors 85 (also referred to as trench isolation conductors) in DTI structure 20. Each trench isolation connector 85 includes a respective conductive via 86 and a respective conductive pad 88. Conductive vias 86 and conductive pads 88 include electrically conductive material, such as tungsten, ruthenium, molybdenum, cobalt, copper, aluminum, titanium, tantalum, iridium, palladium, platinum, nickel, tin, gold, silver, graphite, other suitable electrically conductive materials, alloys thereof, silicides thereof, or combinations thereof. In some embodiments, conductive vias 86 and conductive pads 88 include the same electrically conductive materials and/or the same structures (e.g., same number of layers and/or same configurations of layers). In some embodiments, conductive vias 86 and conductive pads 88 include different electrically conductive materials and/or different structures (e.g., different numbers of layers and/or different configurations of the same number of layers). In some embodiments, conductive vias 86 and/or conductive pads 88 have multilayer structures, such as a liner and a bulk layer.

Conductive vias 86 are disposed in DTI structure 20. In a cross-sectional view (FIG. 2B), DTI structure 20 is disposed between sidewalls of conductive vias 86 and substrate 12 (and/or features disposed therein, such as doped wells), and in a top view, DTI structure 20 surrounds conductive vias 86. DTI structure 20 can thus electrically isolate conductive vias 86 from substrate 12 and/or features therein. Conductive vias 86 have a depth D5 into substrate 12 and a width W4. Depth D5 may be along the z-direction between surface 12A of substrate 12 and bottom surfaces of conductive vias 86, and width W4 may be along the x-direction between opposing sidewalls of conductive vias 86. Depth D5 is greater than or equal to depth D1. In the depicted embodiment, conductive vias 86 extend through an entirety of DTI structure 20 and depth D5 is equal to depth D1. In some embodiments, depth D5 is about 1 μm to about 3 μm. Width W4 is less than width W3 of DTI structure 20. From a top view, conductive vias 86 may have a circular shape and/or an oval shape. In such embodiments, conductive vias 86 may be conductive cylinders within DTI structure 20, and width W4 corresponds with a diameter of conductive vias 86. In some embodiments, conductive vias 86 may have square-shaped top profiles, rectangular-shaped top profiles, hexagonal-shaped top profiles, octagonal-shaped top profiles, or other suitable shaped top profiles. In embodiments where conductive vias 86 have rectangular-shaped profiles, width W4 may also be along the y-direction, such as where conductive vias 86 are oriented lengthwise along the x-direction and the y-direction.

Conductive pads 88 are disposed over surface 12A of substrate 12. For example, conductive pads 88 are disposed on top surfaces of conductive vias 86 and the top surface of DTI structure 20. In a top view (FIG. 2A), conductive pads 88 are disposed in DTI structure 20 and spaced a distance from substrate 12 and/or features in and/or on substrate 12. Conductive pads 88 have a thickness T2 and a width W5. Thickness T2 may be along the z-direction between top surfaces of conductive pads 88 and bottom surfaces of conductive pads 88 (and/or surface 12A of substrate 12), and width W5 may be along the x-direction (and/or the y-direction where conductive pads 88 are oriented lengthwise along the x-direction and the y-direction) between opposing sidewalls of conductive pads 88. Thickness T2 is less than depth D5, width W5 is greater than width W4 and less than width W3, and a total thickness of trench isolation connectors 85 is a sum of thickness T2 and depth D5. From a top view, conductive pads 88 may have a square shape and/or a rectangular shape. In some embodiments, conductive pads 88 may have circle-shaped top profiles, oval-shaped top profiles, hexagonal-shaped top profiles, octagonal-shaped top profiles, or other suitable shaped top profiles. In some embodiments, conductive pads 88 are omitted from trench isolation connectors 85.

Trench isolation connectors 85 are discrete and independent segments that are arranged to form a trench isolation connector ring in DTI structure 20. For example, DTI structure 20 has a top portion, a bottom portion, a first side portion, and a second side portion that combine to form the rectangular-shaped isolation ring. Trench isolation connectors 85 can be divided into a first group 85A disposed in the top portion of DTI structure 20, a second group 85B disposed in the bottom portion of DTI structure 20, a third group 85C disposed in the first side portion of DTI structure 20, and a fourth group 85D disposed in the second side portion of DTI structure 20. First group 85A, second group 85B, third group 85C, and fourth group 85D combine to form a trench isolation connector ring that is rectangular-shaped. Trench isolation connectors 85 of first group 85A and second group 85B are horizontally aligned and arranged in respective lines along the x-direction, and trench isolation connectors 85 of third group 85C and fourth group 85D are vertically aligned and arranged in respective lines along the y-direction. In some embodiments, trench isolation connectors 85 of first group 85A, second group 85B, third group 85C, fourth group 85D, or combinations thereof may not be aligned and/or may be arranged in a different configuration (e.g., non-linear, zigzag, alternating, etc.). In some embodiments, trench isolation connectors 85 may be arranged in a different pattern in DTI structure 20. In some embodiments, the trench isolation connector ring may be a square ring, a circular ring, an oval ring, a hexagonal ring, an octagonal ring, or other suitable shaped ring.

In some embodiments, trench isolation connectors 85 of device 10 have the same materials and/or same configurations. In some embodiments, trench isolation connectors 85 of device 10 have different materials and/or different configurations. In some embodiments, conductive vias 86 have the same materials and/or same configurations. In some embodiments, conductive vias 86 have different materials and/or different configurations. In some embodiments, conductive pads 88 have the same materials and/or same configurations. In some embodiments, conductive pads 88 have different materials and/or different configurations.

Figures 3A, 3B, 3C:
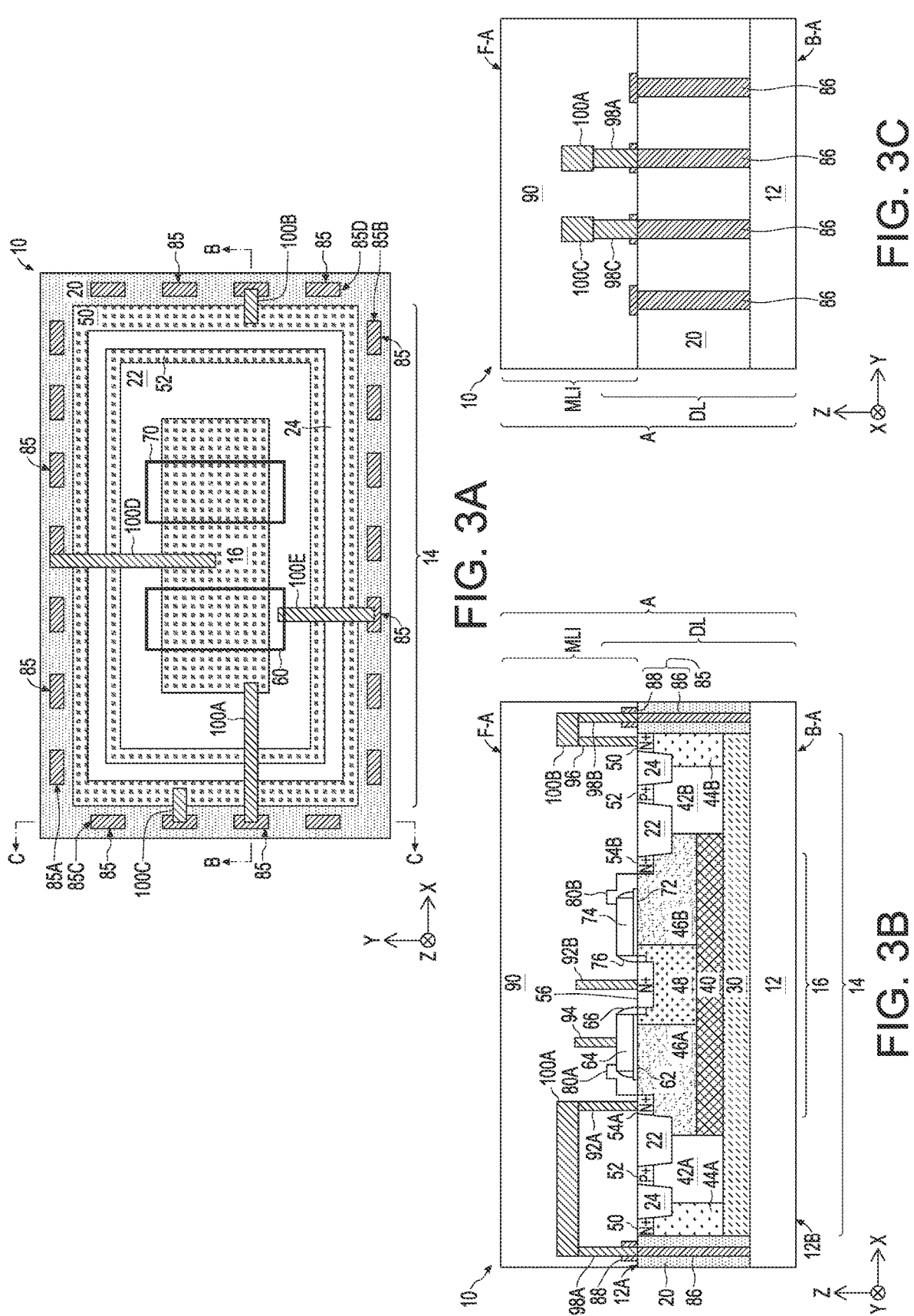

Turning to FIGS. 3A-3C, device 10 includes a multilayer interconnect MLI disposed over a device layer DL. In such embodiments, a top surface of multilayer interconnect MLI provides frontside F-A of wafer A and surface 12B of substrate 12 (e.g., a bottom surface of device layer DL) provides backside B-A of wafer A. Device layer DL can include circuitry fabricated thereon and/or thereover by front-end-of-line (FEOL) processing, such as a high voltage transistor configured as described in FIG. 1A, FIG. 1B, FIG. 2A, and FIG. 2B.

Multilayer interconnect MLI can include circuitry fabricated on and/or over device layer DL by middle-of-line (MOL) processing and/or back-end-of-line (BEOL) processing. Multilayer interconnect MLI electrically connects devices of device layer DL (e.g., high voltage transistors), components of device layer DL, devices (e.g., a memory device) within multilayer interconnect MLI, components of multilayer interconnect MLI, or combinations thereof, such that the various devices and/or components can operate as specified by design requirements of device 10. Multilayer interconnect MLI includes a combination of dielectric layers (generally depicted as an insulation layer 90) and electrically conductive layers (e.g., patterned metal layers formed by conductive lines, conductive vias, conductive contacts, or combinations thereof) configured to form interconnect (routing) structures. The conductive layers form vertical interconnect structures, such as device-level contacts and/or vias, that connect horizontal interconnect structures, such as conductive lines, in different layers/levels (or different planes) of multilayer interconnect MLI. In some embodiments, the interconnect structures route electrical signals between devices and/or components of device layer DL and/or multilayer interconnect MLI. In some embodiments, the interconnect structures distribute electrical signals (for example, clock signals, voltage signals, and/or ground signals) to the devices and/or the device components of device layer DL and/or multilayer interconnect MLI.

In FIGS. 3A-3C, multilayer interconnect MLI includes a device-level interconnect layer (which can include a device-level contact layer (CO level) and/or a device-level via layer (VG/VD level)) and a metal zero layer (M0 level). In some embodiments, multilayer interconnect MLI includes a via zero layer (V0 level), a metal one layer (M1 level), a via one layer (V1 level), a metal two layer (M2 level), a via two layer (V2 level), a metal three layer (M3 level) and so on up to via (X−1) layer (V(X−1) level) and metal X layer (MX level). V0 level includes a portion of insulation layer 90 having V0 vias disposed therein, where V0 vias connect M0 lines to M1 lines. M1 level includes a portion of insulation layer 90 having M1 lines disposed therein. V1 level includes a portion of insulation layer 90 having V1 vias disposed therein, where V1 vias connect M1 lines to M2 lines. M2 level includes a portion of insulation layer 90 having M2 lines disposed therein. V2 level includes a portion of insulation layer 90 having V2 vias disposed therein, where V2 vias connect M2 lines to M3 lines. M3 level includes a portion of insulation layer 90 having M3 lines disposed therein. V(X−1) level includes a portion of insulation layer 90 having V(X−1) vias disposed therein, where V(X−1) vias connect M(X−1) lines to MX lines. MX level includes a portion of insulation layer 90 having MX lines disposed therein. MX level may be a topmost metal layer of multilayer interconnect MLI.

Each level of multilayer interconnect MLI includes a respective electrically conductive layer (e.g., conductive lines, conductive vias, conductive contacts, or combinations thereof) disposed in a respective insulation layer (e.g., an ILD layer and/or a CESL). For example, device-level interconnect layer includes a portion of insulation layer 90 having source/drain contacts MD and/or source/drain vias VD (collectively referred to as source/drain contacts, such as a source/drain contact 92A to source 54A and a source/drain contact 92B to drain 56), gate vias VG (e.g., a gate via 94 to gate structure 60), device-level contacts (e.g., contact 96 to n-doped region 50), and trench isolation connector (TIC) contacts and/or TIC vias (e.g., a TIC contact 98A, a TIC contact 98B, and a TIC contact 98C) disposed therein. M0 level includes a portion of insulation layer 90 having M0 lines disposed therein, such as a conductive line 100A, a conductive line 100B, a conductive line 100C, a conductive line 100D, and a conductive line 100E. Source/drain contact 92A connects source 54A to conductive line 100A, source/drain contact 92B connects drain 56 to conductive line 100D, gate via 94 connects active gate stack of gate structure 60 to conductive line 100E, contact 96 connects n-doped region 50 to conductive line 100B, TIC 98A connects a respective trench isolation connector 85 to conductive line 100A, TIC 98B connects a respective trench isolation connector 85 to conductive line 100B, and TIC 98C connects a respective trench isolation connector 85 to conductive line 100C. In the depicted embodiment, source 54A is electrically connected to a respective trench isolation connector 85 by source/drain contact 92A, conductive line 100A, and TIC 98A; drain 56 is electrically connected to a respective trench isolation connector 85 by source/drain contact 92B, conductive line 100D, and a respective TIC: active gate stack of gate structure 60 is electrically connected to a respective trench isolation connector 85 by gate via 94, conductive line 100E, and a respective TIC; n-doped region 50 is electrically connected to a respective trench isolation connector 85 by contact 96, conductive line 100B, and TIC 98B; and n-doped region 50 may be further electrically connected to a respective trench isolation connector 85 in group 85C by a respective contact, conductive line 100C, and a respective TIC.

Figures 4A, 4B, 4C:
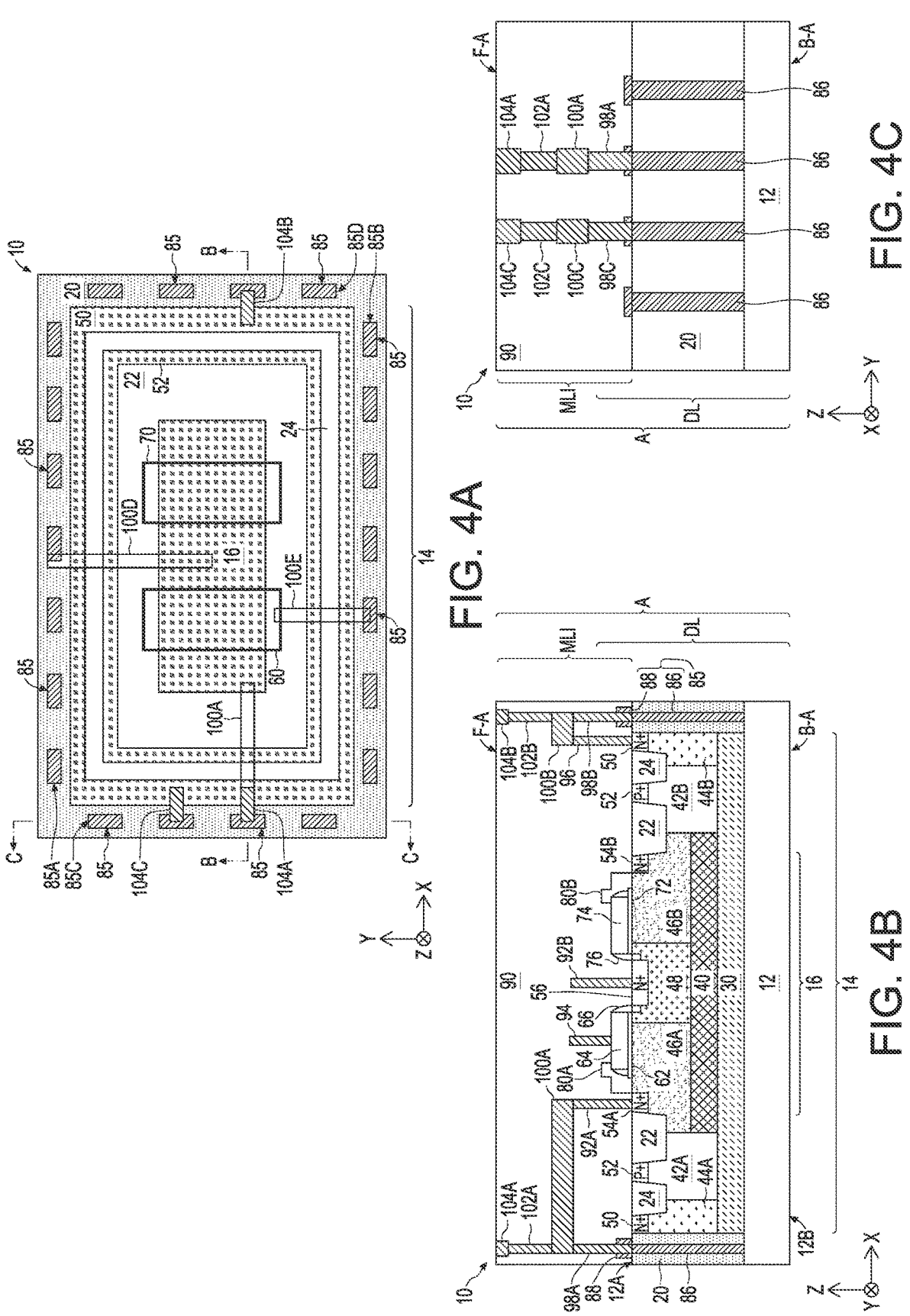

Turning to FIGS. 4A-4C, multilayer interconnect MLI further includes a via (X−1) layer (V(X−1) level) and a metal X layer (MX level), where X is an integer greater than or equal to 1. V(X−1) level includes a portion of insulation layer 90 having conductive vias disposed therein, such as a conductive via 102A, a conductive via 102B, and a conductive via 102C. MX level includes a portion of insulation layer 90 having MX lines disposed therein, such as a conductive line 104A, a conductive line 104B, and a conductive line 104C. Conductive vias 102A-102C connect conductive lines 100A-100C, respectively, to conductive lines 104A-104C, respectively. In some embodiments. X equals 1, V(X−1) level is a V0 level of multilayer interconnect MLI, and MX level is an M1 level of multilayer interconnect. In such embodiments, conductive vias 102A-102C are V0 vias and conductive lines 104A-104C are M1 lines. In some embodiments, conductive vias 102A-102C extend through one or more layers of multilayer interconnect MLI. For example, conductive vias 102A-102C extend through a V0 level, an M1 level, a V1 level, and so on to an MX level, which includes conductive lines 104A-104C. In some embodiments, conductive line 104A and/or conductive line 104B are bonding pads. MX level may be a topmost metal layer of multilayer interconnect MLI.

Source/drain contact 92A, source/drain contact 92B, gate via 94, contact 96, TICs 98A-98C, conductive lines 100A-100E, conductive vias 102A-102C, and conductive lines 104A-104C include electrically conductive material, such as tungsten, ruthenium, molybdenum, cobalt, copper, aluminum, titanium, tantalum, iridium, palladium, platinum, nickel, tin, gold, silver, graphite, other suitable electrically conductive materials, alloys thereof, silicides thereof, or combinations thereof. In some embodiments, source/drain contact 92A, source/drain contact 92B, gate via 94, contact 96, TICs 98A-98C, conductive lines 100A-100E, conductive vias 102A-102C, conductive lines 104A-104C, or combinations thereof include the same electrically conductive materials and/or the same structures. In some embodiments, source/drain contact 92A, source/drain contact 92B, gate via 94, contact 96, TICs 98A-98C, conductive lines 100A-100E, conductive vias 102A-102C, conductive lines 104A-104C, or combinations thereof include different electrically conductive materials and/or different structures. In some embodiments source/drain contact 92A, source/drain contact 92B, gate via 94, contact 96, TICs 98A-98C, conductive lines 100A-100E, conductive vias 102A-102C, conductive lines 104A-104C, or combinations thereof have multilayer structures, such as a liner and a bulk layer.

Figure 5:
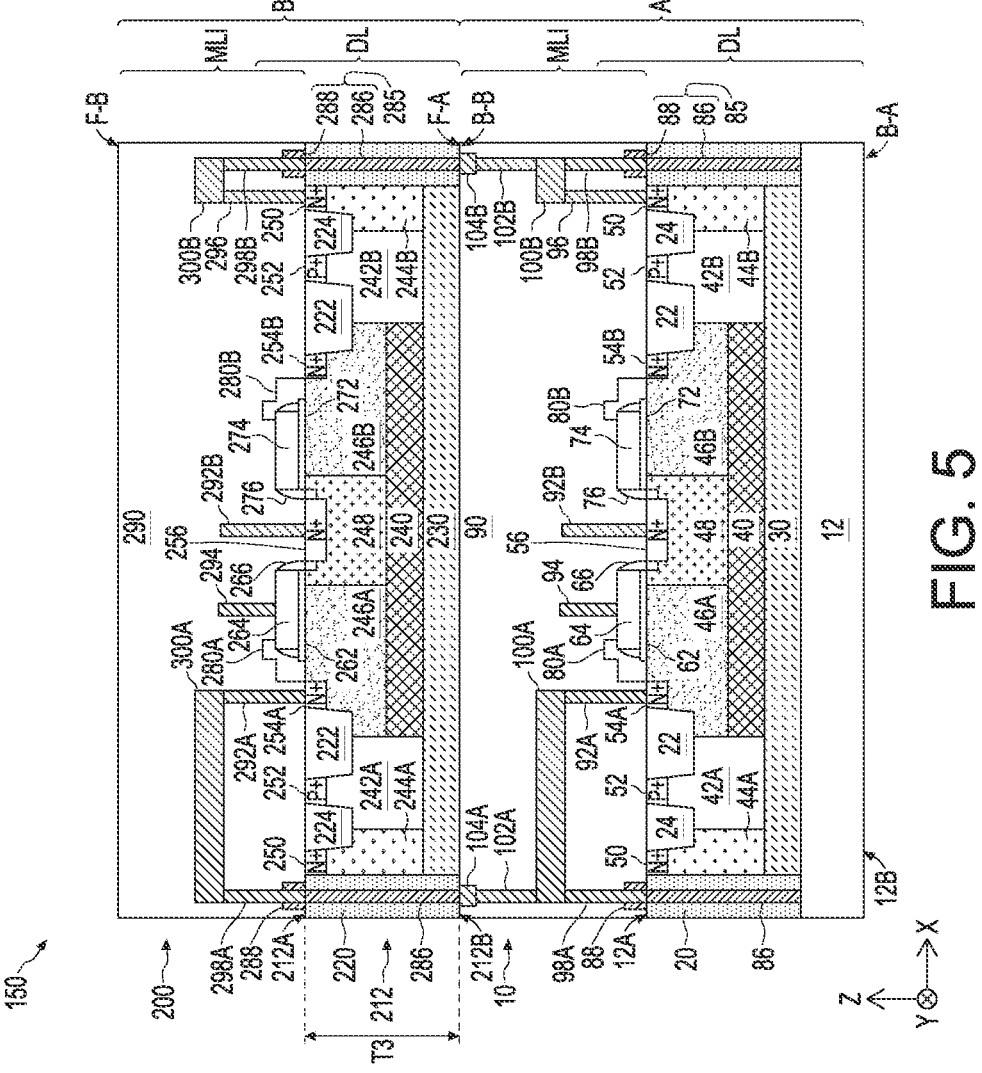
FIGS. 5-9 are fragmentary cross-sectional views of various stacked device structures, in portion or entirety, according to various aspects of the present disclosure.

FIG. 5 is a diagrammatic cross-sectional view of a stacked device structure 150, in portion or entirety, according to various aspects of the present disclosure. Stacked device structure 150 is a wafer-on-wafer (WoW) structure that includes wafer A attached and/or bonded to a wafer B. Wafer A includes device 10, and wafer B includes a device 200 that is similar to device 10. For example, device 200 has a substrate 212 (having a surface 212A and a surface 212B), a DTI structure 220, an STI structure 222, an STI structure 224, a buried layer 230, a DPW 240, an n-well 242A, an n-well 242B, a p-well 244A, a p-well 244B, an n-well 246A, an n-well 246B, a p-well 248, an n-doped region 250, a p-doped region 252, an n-doped region 254A, an n-doped region 254B, an n-doped region 256, a gate structure (e.g., a gate dielectric 262, a gate electrode 264, and gate spacers 266), another gate structure (e.g., a gate dielectric 272, a gate electrode 274, and gate spacers 276), RPOs 280, trench isolation connectors 285 (including, for example, conductive vias 286 and conductive pads 288), an insulation layer 290, a source/drain contact 292A, a source/drain contact 292B, a gate via 294, a contact 296, a TIC 298A, a TIC 298B, a conductive line 300A, and a conductive line 300B. Wafer B has a frontside F-B (e.g., provided by its multilayer interconnect MLI, such as a top surface of insulation layer 290) and a backside B-B (e.g., provided by a surface 212B of substrate 212). In some embodiments, stacked device structure 150 includes a stack of high voltage devices (e.g., high voltage transistors), such as a first high voltage device (e.g., device 10) disposed vertically above or below a second high voltage device (e.g., device 200). The first high voltage device is physically and/or electrically connected to the second high voltage device using trench isolation connectors as described herein. FIG. 5 has been simplified for the sake of clarity to better understand the inventive concepts of the present disclosure. Additional features can be added in stacked device structure 150, and some of the features described below can be replaced, modified, or eliminated in other embodiments of stacked device structure 150.

In FIG. 5, wafer A's frontside F-A is directly attached and/or bonded to wafer B's backside B-B, and device 10 of wafer A is electrically connected to device 200 of wafer B. For example, wafer A's MLI interconnect is attached and/or bonded to wafer B's substrate surface 212B. To facilitate such connection, a thickness of substrate 212 is reduced from thickness T1 to a thickness T3 to expose wafer B's trench isolation connectors 285. In the depicted embodiment, conductive line 104A of wafer A is physically and/or electrically connected to a respective trench isolation connector 285 of wafer B, conductive line 104B of wafer A is physically and/or electrically connected to a respective trench isolation connector 285 of wafer B, and insulation layer 90 physically contacts buried layer 230 and DTI structure 220 of wafer B. Accordingly, source 254A of device 200 is electrically connected to source 54A of device 10 by source/drain contact 292A, conductive line 300A, TIC 298A, a respective trench isolation connector 285 (i.e., a respective conductive pad 288 and a respective conductive via 286), conductive line 104A, conductive via 102A, conductive line 100A, and source/drain contact 92A. Further, n-doped region 250 of device 200 (e.g., a guard ring thereof) is electrically connected to n-doped region 50 of device 10 by contact 296, conductive line 300B, TIC 298B, a respective trench isolation connector 285 (i.e., a respective conductive pad 288 and a respective conductive via 286), conductive line 104B, conductive via 102B, conductive line 100B, and contact 96.

Figure 6:
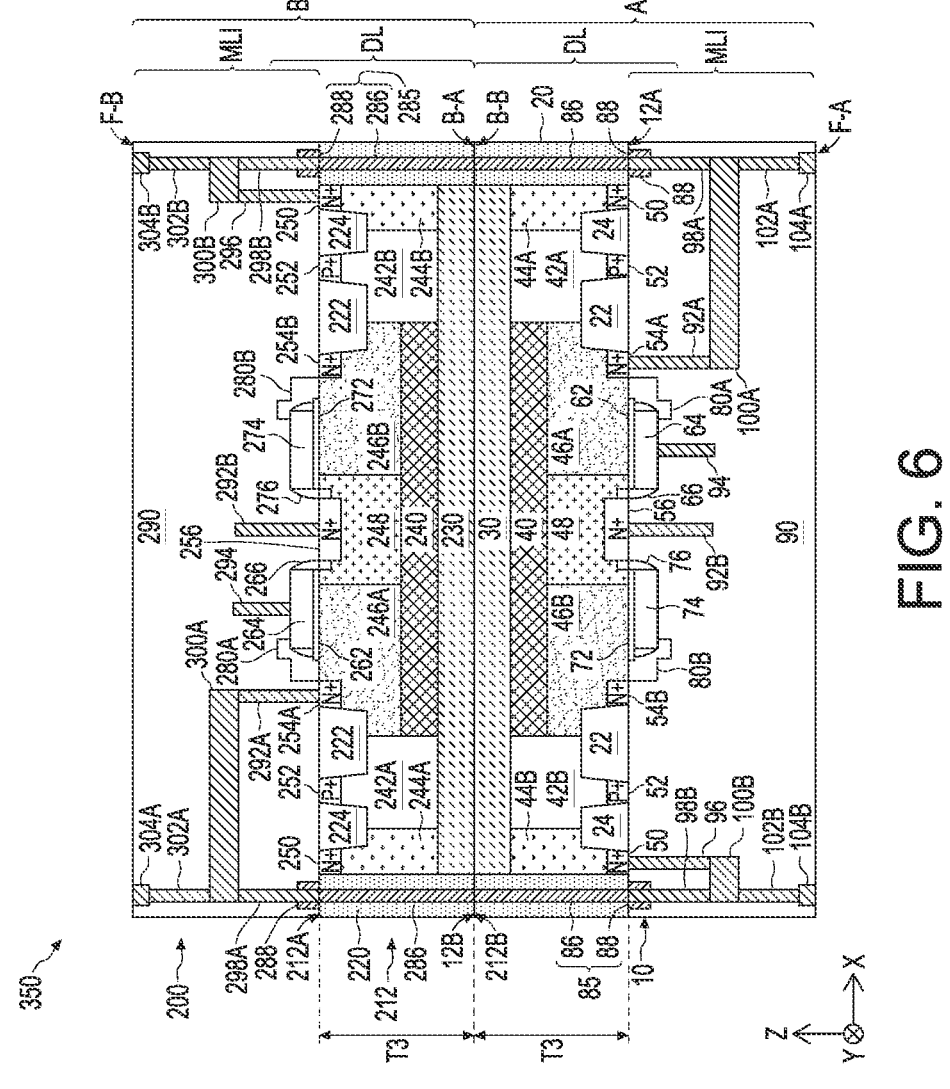

FIG. 6 is a diagrammatic cross-sectional view of a stacked device structure 350, in portion or entirety, according to various aspects of the present disclosure. Stacked device structure 350 is a WoW structure that includes wafer A attached and/or bonded to wafer B. In FIG. 6, wafer A's backside B-A is directly attached and/or bonded to wafer B's backside B-B, and device 10 of wafer A is electrically connected to device 200 of wafer B. For example, wafer A's substrate surface 12B is attached and/or bonded to wafer B's substrate surface 212B. To facilitate such connection, thicknesses of substrate 12 and substrate 212 are reduced from thickness T1 to thickness T3 to expose trench isolation connectors 85 and trench isolation connectors 285, respectively, at back surfaces thereof. In the depicted embodiment, trench isolation connectors 85 of wafer A are physically and/or electrically connected to respective trench isolation connectors 285 of wafer B (e.g., conductive vias 86 physically contact conductive vias 286 and DTI structure 20 physically contacts DTI structure 220) and buried layer 30 of wafer A is physically and/or electrically connected buried layer 230 of wafer B. Accordingly, source 254A of device 200 is electrically connected to n-doped region 50 of device 10 by source/drain contact 292A, conductive line 300A, TIC 298A, a respective trench isolation connector 285 (i.e., a respective conductive pad 288 and a respective conductive via 286), a respective trench isolation connector 85 (i.e., a respective conductive pad 88 and a respective conductive via 86), TIC 98B, conductive line 100B, and contact 96. Further, n-doped region 250 of device 200 is electrically connected to source 54A of device 10 by contact 296, conductive line 300B, TIC 298B, a respective trench isolation connector 285 (i.e., a respective conductive pad 288 and a respective conductive via 286), a respective trench isolation connector 85 (i.e., a respective conductive pad 88 and a respective conductive via 86), TIC 98A, conductive line 100A, and source/drain contact 92A. In FIG. 6, device 10 includes conductive via 102A, conductive via 102B, conductive line 104A, and conductive line 104B, which can be physically and/or electrically connected to other devices and/or voltages, and device 200 includes a conductive via 302A, a conductive via 302B, a conductive line 304A, and a conductive line 304B, which can be physically and/or electrically connected to other devices and/or voltages. In some embodiments, conductive via 102A, conductive via 102B, conductive line 104A, conductive line 104B, or combinations thereof and/or conductive via 302A, conductive via 302B, conductive line 304A, conductive line 304B, or combinations thereof are omitted from device 10 and/or device 200. FIG. 6 has been simplified for the sake of clarity to better understand the inventive concepts of the present disclosure. Additional features can be added in stacked device structure 350, and some of the features described below can be replaced, modified, or eliminated in other embodiments of stacked device structure 350.

Figure 7:
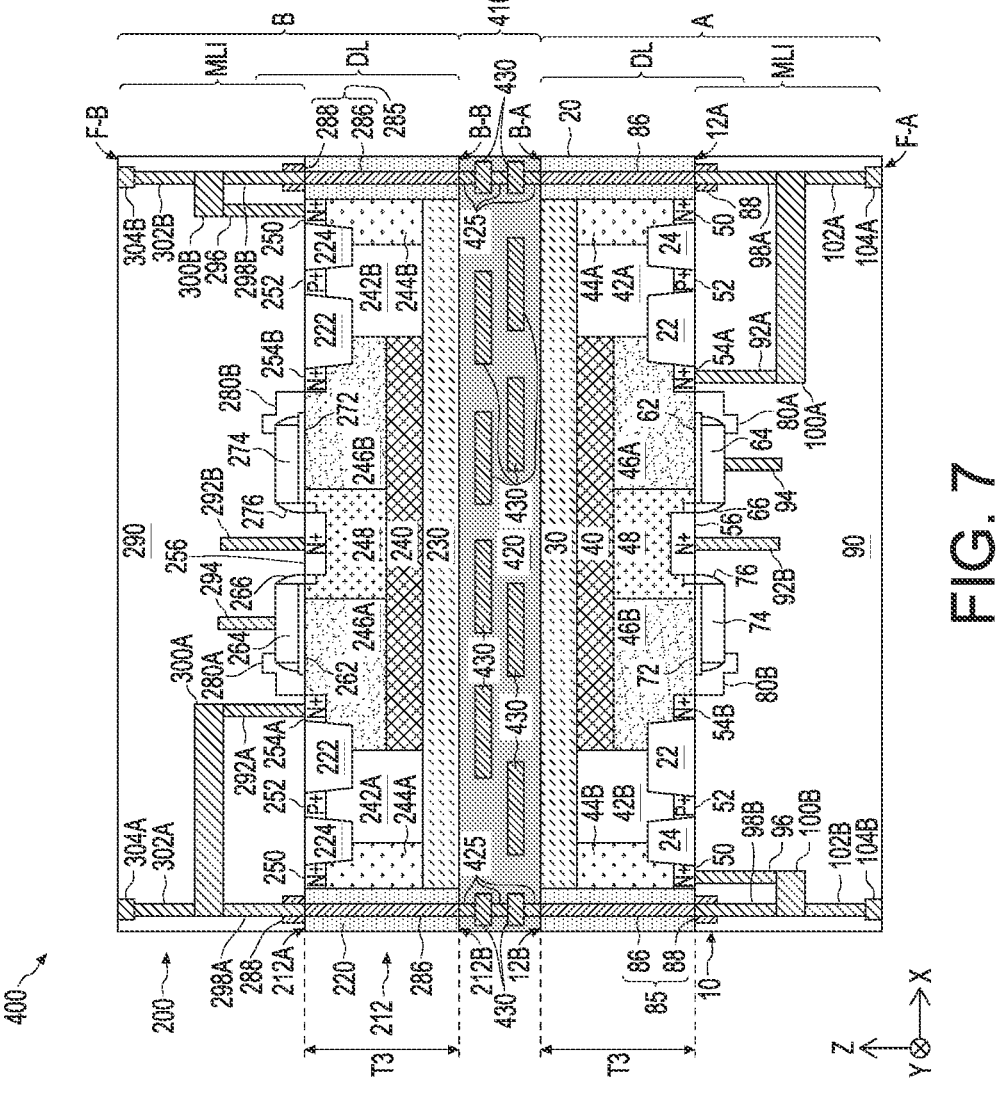

FIG. 7 is a diagrammatic cross-sectional view of a stacked device structure 400, in portion or entirety, according to various aspects of the present disclosure. Stacked device structure 400 is a WoW structure that includes wafer A attached and/or bonded to wafer B. In FIG. 7, wafer A's backside B-A is attached and/or bonded to wafer B's backside B-B by a bonding layer (wafer) 410, and device 10 of wafer A is electrically connected to device 200 of wafer B by bonding layer 410. Bonding layer 410 is attached to and/or bonded to wafer A's backside B-A and wafer B's backside B-B. For example, wafer A's substrate surface 12B is attached and/or bonded to a first side of bonding layer 410 and wafer B's substrate surface 212B is attached and/or bonded to a second side of bonding layer 410. Bonding layer 410 includes an insulation layer 420 having conductive vias 425 and conductive lines 430 disposed therein, and an interconnect structure of bonding layer 410 (for example, a combination of conductive vias 425 and conductive lines 430) electrically connects wafer A and wafer B. In the depicted embodiment, wafer A's trench isolation connectors 85 are physically and/or electrically connected to respective conductive vias 425 of bonding layer 410 (e.g., conductive vias 86 physically contact conductive vias 425), wafer B's trench isolation connectors 285 are physically and/or electrically connected to respective conductive vias 425 of bonding layer 410 (e.g., conductive vias 286 physically contact conductive vias 425), DTI structure 20 and DTI structure 220 physically contact insulation layer 420, and buried layer 30 and buried layer 230 physically contact insulation layer 420. Accordingly, source 254A of device 200 is electrically connected to n-doped region 50 of device 10 by source/drain contact 292A, conductive line 300A, TIC 298A, a respective trench isolation connector 285 (i.e., a respective conductive pad 288 and a respective conductive via 286), a respective interconnect structure of bonding layer 410 (e.g., a combination of conductive vias 425 and conductive lines 430), a respective trench isolation connector 85 (i.e., a respective conductive pad 88 and a respective conductive via 86), TIC 98B, conductive line 100B, and contact 96. Further, n-doped region 250 of device 200 is electrically connected to source 54A of device 10 by contact 296, conductive line 300B, TIC 298B, a respective trench isolation connector 285 (i.e., a respective conductive pad 288 and a respective conductive via 286), a respective interconnect structure of bonding layer 410 (e.g., a combination of conductive vias 425 and conductive lines 430), a respective trench isolation connector 85 (i.e., a respective conductive pad 88 and a respective conductive via 86), TIC 98A, conductive line 100A, and source/drain contact 92A. FIG. 7 has been simplified for the sake of clarity to better understand the inventive concepts of the present disclosure. Additional features can be added in stacked device structure 400, and some of the features described below can be replaced, modified, or eliminated in other embodiments of stacked device structure 400.

Figure 8:
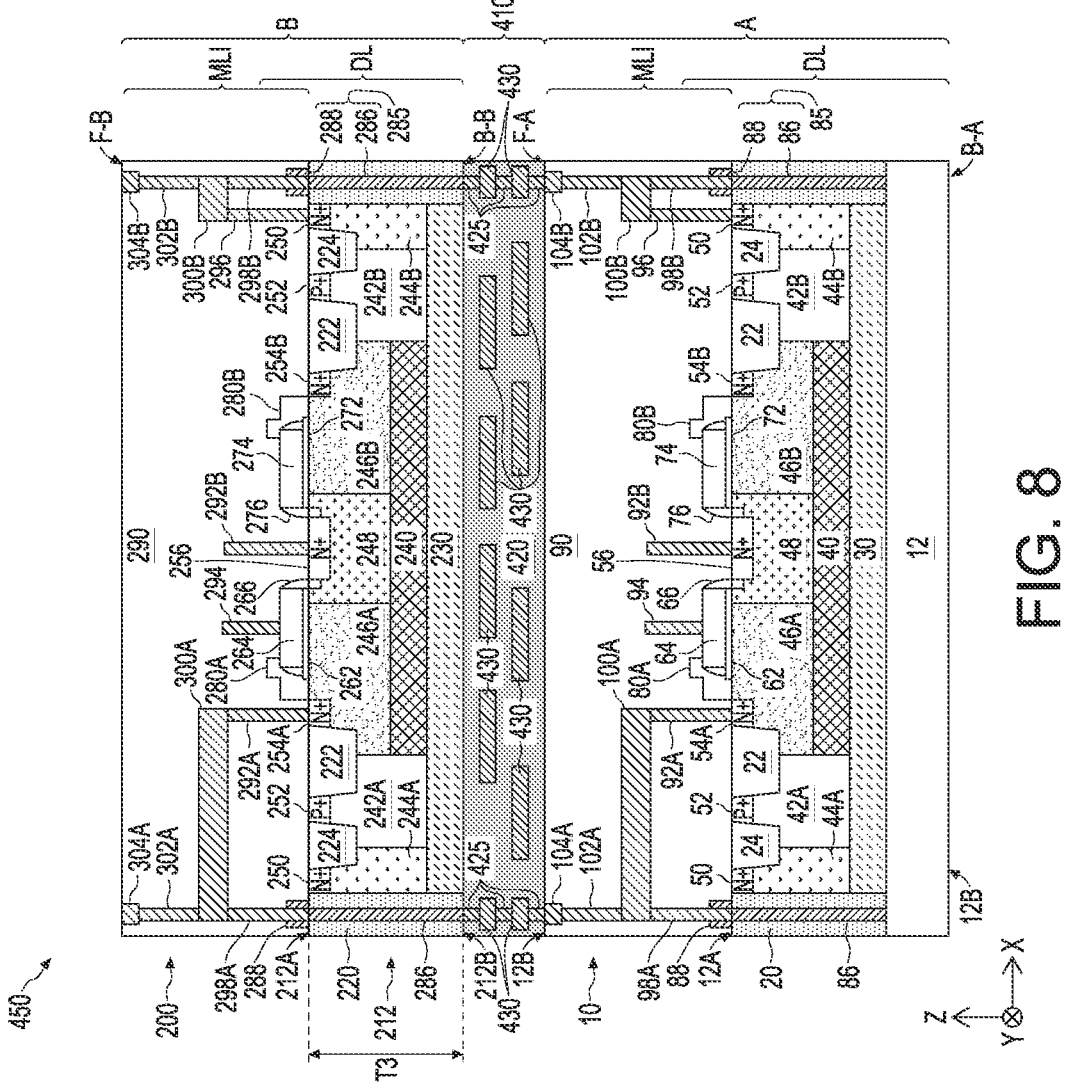

FIG. 8 is a diagrammatic cross-sectional view of a stacked device structure 450, in portion or entirety, according to various aspects of the present disclosure. Stacked device structure 450 is a WoW structure that includes wafer A attached and/or bonded to wafer B. In FIG. 8, wafer A's frontside F-A is attached and/or bonded to wafer B's backside B-B by bonding layer (wafer) 410, and device 10 of wafer A is electrically connected to device 200 of wafer B by bonding layer 410. Bonding layer 410 is attached to and/or bonded to wafer A's frontside F-A and wafer B's backside B-B. For example, wafer A's multilayer interconnect MLI (e.g., top surface of insulation layer 90) is attached and/or bonded to a first side of bonding layer 410 and wafer B's substrate surface 212B is attached and/or bonded to a second side of bonding layer 410. In the depicted embodiment, wafer A's conductive line 104A is physically and/or electrically connected to a respective conductive via 425 of bonding layer 410, wafer A's conductive line 104B is physically and/or electrically connected to a respective conductive via 425 of bonding layer 410, wafer B's trench isolation connectors 285 are physically and/or electrically connected to respective conductive vias 425 of bonding layer 410 (e.g., conductive vias 286 physically contact conductive vias 425), wafer A's insulation layer 90 physically contacts insulation layer 420 of bonding layer 410, wafer B's DTI structure 220 physically contacts insulation layer 420, and wafer B's buried layer 230 physically contacts insulation layer 420. Accordingly, source 254A of device 200 is electrically connected to source 54A of device 10 by source/drain contact 292A, conductive line 300A, TIC 298A, a respective trench isolation connector 285 (i.e., a respective conductive pad 288 and a respective conductive via 286), a respective interconnect structure of bonding layer 410 (e.g., a combination of conductive vias 425 and conductive lines 430), conductive line 104A, conductive via 102A, conductive line 100A, and source/drain contact 92A. Further, n-doped region 250 of device 200 is electrically connected to n-doped region 50 of device 10 by contact 296, conductive line 300B, TIC 298B, a respective trench isolation connector 285 (i.e., a respective conductive pad 288 and a respective conductive via 286), a respective interconnect structure of bonding layer 410 (e.g., a combination of conductive vias 425 and conductive lines 430), conductive line 104B, conductive via 102B, conductive line 100B, and contact 96. FIG. 8 has been simplified for the sake of clarity to better understand the inventive concepts of the present disclosure. Additional features can be added in stacked device structure 450, and some of the features described below can be replaced, modified, or eliminated in other embodiments of stacked device structure 450.

Figure 9:
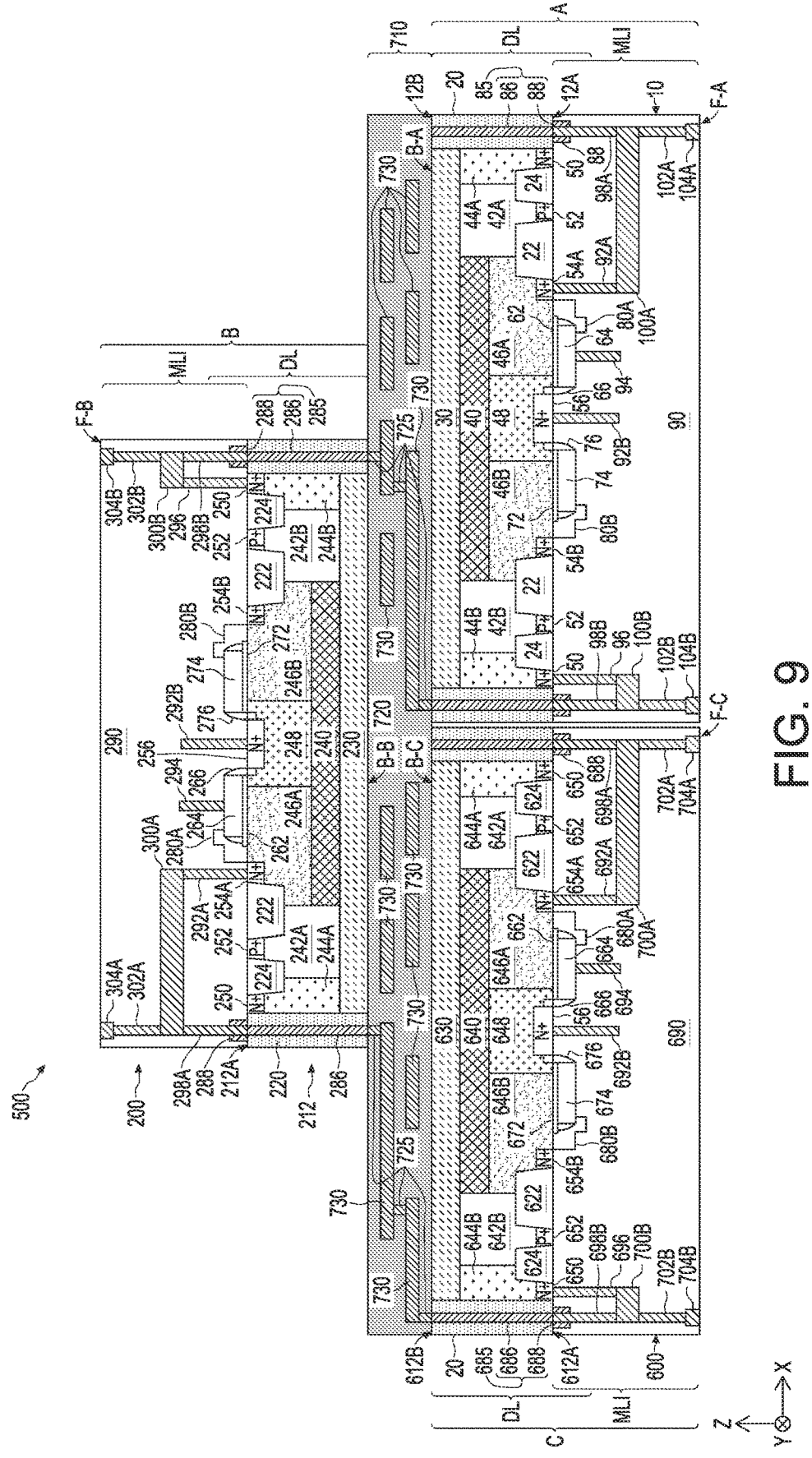

FIG. 9 is a diagrammatic cross-sectional view of a stacked device structure 500, in portion or entirety, according to various aspects of the present disclosure. Stacked device structure 500 is a WoW structure that includes wafer B attached and/or bonded to wafer A and a wafer C. Wafer A includes device 10, wafer B includes device 200, and wafer C includes a device 600 that is similar to device 10. For example, device 600 has a substrate 612 (having a surface 612A and a surface 612B), a DTI structure 620, an STI structure 622, an STI structure 624, a buried layer 630, a DPW 640, an n-well 642A, an n-well 642B, a p-well 644A, a p-well 644B, an n-well 646A, an n-well 646B, a p-well 648, an n-doped region 650, a p-doped region 652, an n-doped region 654A, an n-doped region 654B, an n-doped region 656, a gate structure (e.g., a gate dielectric 662, a gate electrode 664, and gate spacers 666), another gate structure (e.g., a gate dielectric 672, a gate electrode 674, and gate spacers 676), RPOs 680, trench isolation connectors 685 (including, for example, conductive vias 686 and conductive pads 688), an insulation layer 690, a source/drain contact 692A, a source/drain contact 692B, a gate via 694, a contact 696, a TIC 698A, a TIC 698B, a conductive line 700A, and a conductive line 700B. Wafer C has a frontside F-C(e.g., provided by its multilayer interconnect MLI, such as a top surface of insulation layer 690) and a backside B-C(e.g., provided by a surface 612B of substrate 612). In some embodiments, stacked device structure 500 includes a stack of high voltage devices (e.g., high voltage transistors), such as a first high voltage device (e.g., device 10) and a second high voltage device (e.g., device 600) disposed vertically above or below a third high voltage device (e.g., device 200). The first high voltage device is laterally adjacent to the second high voltage device. The first high voltage device and the second high voltage device are physically and/or electrically connected to the third high voltage device using trench isolation connectors. FIG. 9 has been simplified for the sake of clarity to better understand the inventive concepts of the present disclosure. Additional features can be added in stacked device structure 500, and some of the features described below can be replaced, modified, or eliminated in other embodiments of stacked device structure 500.

In FIG. 9, wafer A's backside B-A and wafer C's backside B-C are attached and/or bonded to wafer B's backside B-B by a bonding layer (wafer) 710, and device 10 of wafer A and device 600 of wafer C are electrically connected to device 200 of wafer B by bonding layer 710. Bonding layer 710 is attached to and/or bonded to wafer A's backside B-A, wafer B's backside B-B, and wafer C's backside B-C. For example, wafer A's substrate surface 12B, is attached and/or bonded to a first side of bonding layer 710, wafer B's substrate surface 212B is attached and/or bonded to a second side of bonding layer 710, and wafer C's substrate surface 612B is attached and/or bonded to the first side of bonding layer 710. Bonding layer 710 includes an insulation layer 720 having conductive vias 725 and conductive lines 730 disposed therein. Interconnect structures of bonding layer 710 (for example, combinations of conductive vias 725 and conductive lines 730) electrically connect wafer B to wafer A and wafer C. In the depicted embodiment, wafer A's trench isolation connectors 85 are physically and/or electrically connected to respective conductive vias 725 of bonding layer 710 (e.g., conductive vias 86 physically contact conductive vias 725), wafer B's trench isolation connectors 285 are physically and/or electrically connected to respective conductive vias 725 of bonding layer 710 (e.g., conductive vias 286 physically contact conductive vias 725), wafer C's trench isolation connectors 685 are physically and/or electrically connected to respective conductive vias 725 of bonding layer 710 (e.g., conductive vias 686 physically contact conductive vias 725), DTI structures (e.g., DTI structure 20, DTI structure 220, and DTI structure 620) physically contact insulation layer 720, and buried layers (e.g., buried layer 30, buried layer 230, and buried layer 630) physically contact insulation layer 720. Accordingly, source 254A of device 200 is electrically connected to n-doped region 650 of device 600 by source/drain contact 292A, conductive line 300A, TIC 298A, a respective trench isolation connector 285 (i.e., a respective conductive pad 288 and a respective conductive via 286), a respective interconnect structure of bonding layer 710 (e.g., a combination of conductive vias 725 and conductive lines 730), a respective trench isolation connector 685 (i.e., a respective conductive pad 688 and a respective conductive via 686), TIC 698B, conductive line 700B, and contact 696. Further, n-doped region 250 of device 200 is electrically connected to n-doped region 50 of device 10 by contact 296, conductive line 300B, TIC 298B, a respective trench isolation connector 285 (i.e., a respective conductive pad 288 and a respective conductive via 286), a respective interconnect structure of bonding layer 710 (e.g., a combination of conductive vias 725 and conductive lines 730), a respective trench isolation connector 85 (i.e., a respective conductive pad 88 and a respective conductive via 86), TIC 98B, conductive line 100B, and contact 96.

Because trench isolation connectors disclosed herein are independent and/or electrically isolated from one another, trench isolation connectors disclosed herein offer flexible backend connections to neighboring devices, such as that depicted in FIG. 10A and FIG. 10B. FIG. 10A is a diagrammatic top view of a stacked device structure 800, in portion or entirety, according to various aspects of the present disclosure. FIG. 10B is a diagrammatic cross-sectional view of stacked device structure 800, in portion or entirety, of FIG. 10A according to various aspects of the present disclosure. Stacked device structure 800 is a WoW structure that includes a wafer 810 attached and/or bonded to a wafer 820. Wafer 810 and wafer 820 each include a respective BEOL structure (e.g., a respective multilayer interconnect MLI) disposed over a respective device layer DL. In the depicted embodiment, a backside of wafer 810 (e.g., a bottom surface of a device substrate of its device layer DL) is attached and/or bonded to a frontside of wafer 820 (e.g., a top surface of its BEOL structure). The BEOL structure of wafer 820 provides backend electrical connections between devices of wafer 810, as further described below. FIG. 10A and FIG. 10B have been simplified for the sake of clarity to better understand the inventive concepts of the present disclosure. Additional features can be added in stacked device structure 800, and some of the features described below can be replaced, modified, or eliminated in other embodiments of stacked device structure 800.

In FIG. 10A and FIG. 10B, wafer 810 includes a device 900A and a device 900B, which are formed from portions of device layer DL and BEOL structure of wafer 810. Device 900A and device 900B may be similar to devices described herein. For example, device 900A includes a substrate 912, an active region 916A, a DTI structure 920, an STI structure 922A, an STI structure 924A, an n-doped region 950A, a p-doped region 952A, active gate structures (e.g., a gate structure 960A (G1) and a gate structure 960B (G2)), trench isolation connectors 985 (including, for example, conductive vias 986 and conductive pads 988), an insulation layer 990, a gate via 994A, a gate via 994B, a TIC 998A, and a conductive line 1000A. Device 900B includes substrate 912, an active region 916B, DTI structure 920, an STI structure 922B, an STI structure 924B, an n-doped region 950B, a p-doped region 952B, active gate structures (e.g., a gate structure 960C (G3) and a gate structure 960D (G4)), trench isolation connectors 985 (including, for example, conductive vias 986 and conductive pads 988), insulation layer 990, a gate via 994C, a gate via 994D, a TIC 998B, and a conductive line 1000B. A portion of DTI structure 920 physically and/or electrically separates and/or isolates device 900A and device 900B. Active region 916A and active region 916B can further include a respective buried layer, a respective DPW, respective n-wells, respective p-wells, additional respective n-doped regions and/or p-doped regions, respective RPOs, respective dummy gate structures, etc. In some embodiments, device 900A and device 900B are high voltage devices and/or transistors.

Gate structure 960A and gate structure 960B (e.g., active gate stacks thereof) of device 900A are connected by frontside interconnections. For example, gate structure 960A is electrically connected to gate structure 960B by gate via 994A, conductive line 1000A, and gate via 994B of BEOL structure of wafer 810. Gate structure 960C and gate structure 960D (e.g., active gate stacks thereof) are connected by frontside interconnections. For example, gate structure 960C is electrically connected to gate structure 960D by gate via 994C, conductive line 1000B, and gate via 994D of BEOL structure of wafer 810. Conductive line 1000A and conductive line 1000B are further connected to respective trench isolation connectors 985 by TIC 998A and 998B, respectively. In FIG. 10A, conductive line 1000A and conductive line 1000B are generally L-shaped routing structures, though the present disclosure contemplates other routing structure shapes.

Gate terminals of device 900A and gate terminals of device 900B are connected by trench isolation connectors 985 and backside interconnections and/or backside routing layers provided by wafer 820. For example, wafer 820 includes a substrate 1012, trench isolation connectors 1085

(including, for example, conductive vias 1086 and conductive pads), an insulation layer 1090, a bonding pad 1097A, a bonding pad 1097B, a TIC 1098A, a TIC 1098B, and a conductive line 2000. In some embodiments, bonding pad 1097A and bonding pad 1097B are portions of TIC 1098A and TIC 1098B, respectively. Bonding pad 1097A is physically and/or electrically connected to a respective trench isolation connector 985 of wafer 810 that is connected to gate terminals of device 900A (e.g., G1 and G2). Bonding pad 1097B is physically and/or electrically connected to a respective trench isolation connector 985 of wafer 810 that is connected to gate terminals of device 900B (e.g., G3 and G4). TIC 1098A and TIC 1098B are physically and/or electrically connected to bonding pad 1097A and bonding pad 1097B, respectively, and conductive line 2000 physically and/or electrically connects TIC 1098A and TIC 1098B. Gate terminal G1 and gate terminal G2 of device 900A are thus electrically connected to gate terminal G3 and gate terminal G4 by an interconnect (routing) structure at the backside of wafer 810. Such backside connection may be beneficial where a shortest connection between device 900A and device 900B at the frontside of wafer 810 is through an occupied region OC of BEOL structure of wafer 810, such as where BEOL structure includes interconnect (routing) structures for other device features and/or devices of wafer 810.

Figure 11B:
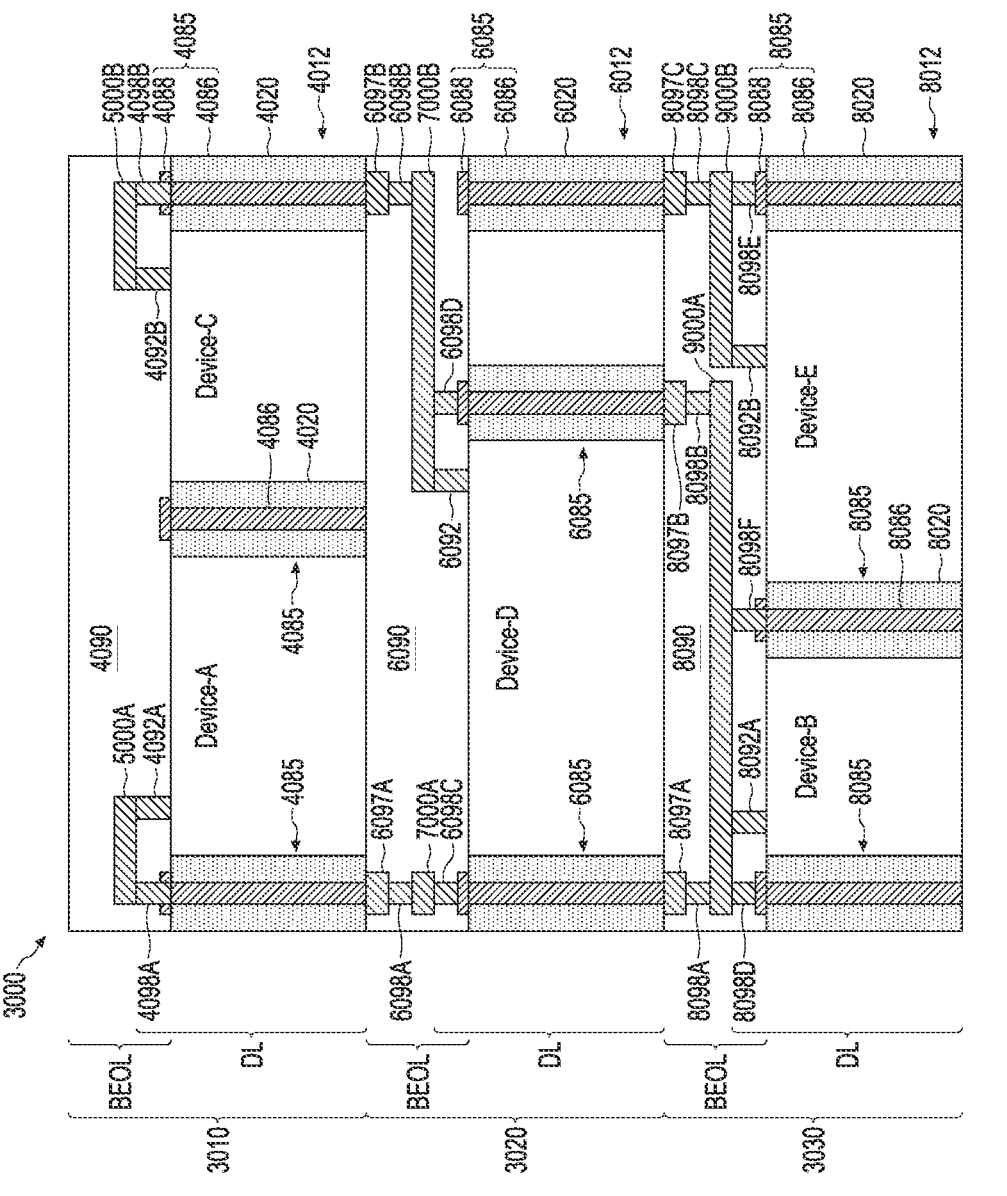

Further, because trench isolation connectors disclosed herein are independent and/or electrically isolated from one another, the trench isolation connectors offer flexible backend connections to devices of stacked device structures, such as that depicted in FIG. 11A and FIG. 11B. FIG. 11A is a diagrammatic top view of a stacked device structure 3000, in portion or entirety, according to various aspects of the present disclosure. FIG. 11B is a diagrammatic cross-sectional view of stacked device structure 3000, in portion or entirety, of FIG. 11A according to various aspects of the present disclosure. Stacked device structure 3000 is a WoW structure that includes a wafer 3010 attached and/or bonded to a wafer 3020, which is further attached and/or bonded to a wafer 3030. Wafer 3010, wafer 3020, and wafer 3030 can be referred to as a $3^{rd}$ floor, $2^{nd}$ floor, and $1^{st}$ floor, respectively, of stacked device structure 3000. Wafer 3010, wafer 3020, and wafer 3030 each include a respective BEOL structure (e.g., a respective multilayer interconnect MLI) disposed over a respective device layer DL. In the depicted embodiment, a backside of wafer 3010 (e.g., a bottom surface of a device substrate of its device layer DL) is attached and/or bonded to a frontside of wafer 3020 (e.g., a top surface of its BEOL structure), and a backside of wafer 3020 (e.g., a bottom surface of a device substrate of its device layer DL) is attached and/or bonded to a frontside of wafer 3030 (e.g., a top surface of its BEOL structure). BEOL structure of wafer 3020 provides backend electrical connections of devices of wafer 3010 to devices of wafer 3020 and/or devices of wafer 3030, and BEOL structure of wafer 3030 provides backend electrical connections of devices of wafer 3010 and devices of wafer 3020 to devices of wafer 3030. Such backend connections are facilitated by trench isolation connectors of wafer 3010, wafer 3020, and wafer 3030, as described below. FIG. 11A and FIG. 11B have been simplified for the sake of clarity to better understand the inventive concepts of the present disclosure. Additional features can be added in stacked device structure 3000, and some of the features described below can be replaced, modified, or eliminated in other embodiments of stacked device structure 3000.

In FIG. 11A and FIG. 11B, stacked device structure 3000 includes various devices, such as a Device-A, a Device-B, a Device-C, a Device-D, a Device-E, and other devices. Wafer 3010 includes Device-A and Device-C, wafer 3020 includes Device-D, and wafer 3030 includes Device-B and Device-E. Device-A and Device-C are formed from portions of device layer DL and BEOL structure of wafer 3010. Device-D is formed from portions of device layer DL and BEOL structure of wafer 3020. Device-B and Device-E are formed from portions of device layer DL and BEOL structure of wafer 3030. Device-A, Device-B, Device-C, Device-D, Device-E, or combinations thereof can be the same types of devices or different types of devices. In some embodiments, Device-B is a high voltage device, such as the high voltage devices described herein, and Device-A, Device-C, Device-D, and Device-E are medium voltage devices, low voltage devices, other types of devices, or combinations thereof. Medium voltage devices can operate at higher voltages (e.g., threshold voltages) than low voltage devices, and high voltage devices can operate at higher voltages than medium voltage devices.

Wafer 3010 includes a substrate 4012, a DTI structure 4020 that defines and isolates various device regions of substrate 4012, trench isolation connectors 4085 (including, for example, conductive vias 4086 and conductive pads 4088), an insulation layer 4090, a device contact 4092A, a device contact 4092B, a TIC 4098A, a TIC 4098B, a conductive line 5000A, and a conductive line 5000B. Device-A and Device-C are electrically isolated from each other and/or other devices of wafer 3010 by DTI structure 4020 and/or other isolation structures, such as STI structures. Device-A is connected to a respective trench isolation connector 4085 by device contact 4092A, conductive line 5000A, and TIC 4098A (collectively referred to as an interconnect (routing) structure). Device-C is connected to a respective trench isolation connector 4085 by device contact 4092B, conductive line 5000B, and TIC 4098B.

Wafer 3020 includes a substrate 6012, a DTI structure 6020 that defines and isolates various device regions of substrate 6012, trench isolation connectors 6085 (including, for example, conductive vias 6086 and conductive pads 6088), an insulation layer 6090, a device contact 6092, a bonding pad 6097A, a bonding pad 6097B, a TIC 6098A, a TIC 6098B, a TIC 6098C, a TIC 6098D, a conductive line 7000A, and a conductive line 7000B. Device-D is electrically isolated from other devices of wafer 3020 by DTI structure 6020 and/or other isolation structures, such as STI structures. Device-D is connected to a respective trench isolation connector 6085 by device contact 6092, conductive line 7000B, and TIC 6098D. Device-D is further connected to Device-C of wafer 3010 by device contact 6092, conductive line 7000B. TIC 6098B, bonding pad 6097B, a respective trench isolation connector 4085 of wafer 3010, TIC 4098B, conductive line 5000B, and device contact 4092B. BEOL structure of wafer 3020 also connects device layer DL of wafer 3010 to device layer DL of wafer 3020. For example, a respective trench isolation connector 4085 of wafer 3010 is connected to a respective trench isolation connector 6085 of wafer 3020 by bonding pad 6097A, TIC 6098A, conductive line 7000A, and TIC 6098C. Since the respective trench isolation connector 4085 is connected to Device-A, BEOL structure of wafer 3020 and the respective trench isolation connector 6085 of wafer 3020 connect Device-A of wafer 3010 to wafer 3030.

Wafer 3030 includes a substrate 8012, a DTI structure 8020 that defines and isolates various device regions of substrate 8012, trench isolation connectors 8085 (including, for example, conductive vias 8086 and conductive pads 8088), an insulation layer 8090, a device contact 8092A, a device contact 8092B, a bonding pad 8097A, a bonding pad 8097B, a bonding pad 8097C, a TIC 8098A, a TIC 8098B, a TIC 8098C, a TIC 8098D, a TIC 8098E, a TIC 8098F, a conductive line 9000A, and a conductive line 9000B. Device-B and Device-E are electrically isolated from each other and/or other devices of wafer 3030 by DTI structure 8020 and/or other isolation structures, such as STI structures.

Device-B is connected to a respective trench isolation connector 8085 by device contact 8092A, conductive line 9000A, and TIC 8098D. Alternatively and/or additionally, Device-B is connected to a respective trench isolation connector 8085 by device contact 8092A, conductive line 9000A, and TIC 8098F. Device-E is connected to a respective trench isolation connector 8085 by device contact 8092B, conductive line 9000B, and TIC 8098E. Device-E is further connected to a respective trench isolation connector 6085 of wafer 3020 by device contact 8092B, conductive line 9000B, TIC 8098C, and bonding pad 8097C.

Device-B is connected to Device-D of wafer 3020 by device contact 8092A, conductive line 9000A, TIC 8098B, bonding pad 8097B, a respective trench isolation connector 6085 of wafer 3020, TIC 6098D, conductive line 7000B, and device contact 6092. Alternatively and/or additionally, Device-B is connected to Device-D by device contact 8092A, conductive line 9000A, TIC 8098A, bonding pad 8097A, a respective trench isolation connector 6085 of wafer 3020, TIC 6098C, conductive line 7000A, and another device contact of wafer 3020 that is connected to conductive line 7000A and Device-D. Trench isolation connectors 6085 of wafer 3020 thus provide substantial interconnection and/ or routing flexibility when connecting devices of wafers of stacked device structure 3000.

Since Device-D is connected to Device-C via BEOL structure of wafer 3020, a respective trench isolation connector 4085 of wafer 3010, and BEOL structure of wafer 3010, Device-B may further be connected to Device-C of wafer 3010. Further, Device-B may be connected to Device-A by BEOL structure of wafer 3030 (e.g., device contact 8092A, conductive line 9000A, TIC 8098A, bonding pad 8097A), a respective trench isolation connector 6085 of wafer 3020, BEOL structure of wafer 3020 (e.g., TIC 6098C, conductive line 7000A, TIC 6098A, and bonding pad 6097A), a respective trench isolation connector 4085 of wafer 3010, and BEOL structure of wafer 3010 (e.g., TIC 4098A, conductive line 5000A, and device contact 4092A). Various devices of stacked devices structure 3000 are thus electrically connected with backside interconnect (routing) structures that include trench isolation connectors, which can significantly increase routing flexibility when interconnecting devices, decrease an area consumed by interconnected devices, improve area efficiency of interconnected devices, etc.

FIGS. 12A-12E are fragmentary diagrammatic cross-sectional views of stacked device structure 150 of FIG. 5, in portion or entirety, at various stages of fabrication thereof according to various aspects of the present disclosure. As described above, stacked device structure 150 includes wafer A and wafer B, where wafer A's frontside is attached and/or bonded to wafer B's backside and wafer A and wafer B are electrically connected to each other using trench isolation connectors. FIGS. 12A-12E have been simplified for the sake of clarity to better understand the inventive concepts of the present disclosure. Additional features can be added in stacked device structure 150, and some of the features described below can be replaced, modified, or eliminated in other embodiments of stacked device structure 150. Additional steps can be provided before, during, and after fabrication of stacked device structure 150 and some of the steps described can be moved, replaced, or eliminated for additional embodiments of stacked device structure 150.

Figures 12A, 12B:
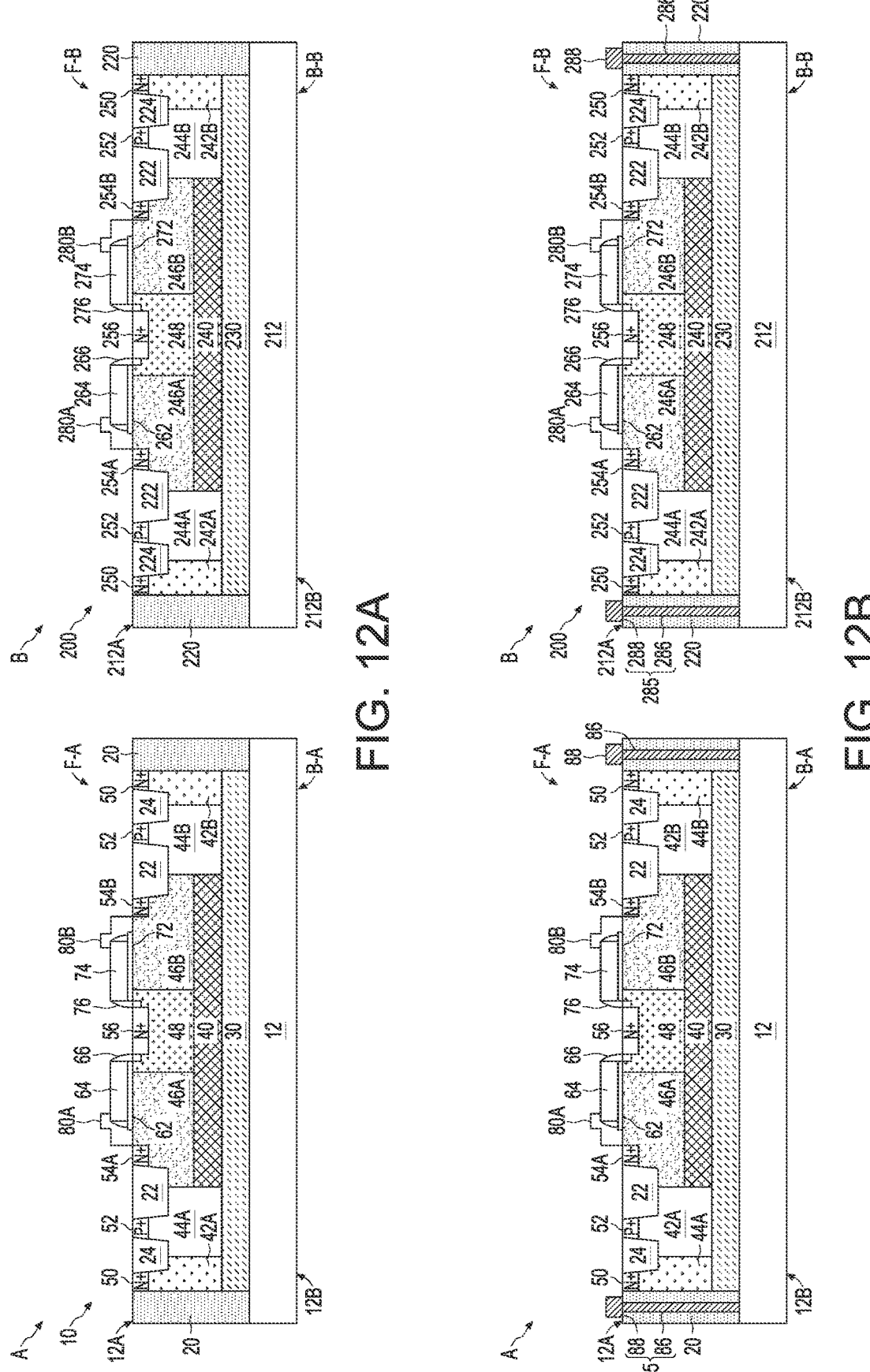
FIGS. 12A-12E are fragmentary diagrammatic cross-sectional views of the stacked device structure of FIG. 5, in portion or entirety, at various stages of fabrication thereof according to various aspects of the present disclosure.

Turning to FIG. 12A, wafer A and wafer B undergo FEOL processing, which includes forming device 10 on wafer A and forming device 200 on wafer B. FEOL processing further includes trench isolation structures of wafer A and wafer B, such as DTI structure 20 and DTI structure 220, which are used to facilitate interconnection between wafer A and wafer B. Forming a trench isolation structure can include forming a patterned mask layer over a substrate, etching the substrate to form a trench therein using the patterned mask layer as an etch mask, depositing an insulation material (e.g., a dielectric material, such as an oxide material) in the trench, and removing the patterned mask layer. In some embodiments, the trench defines a device region of the substrate. In some embodiments, a pattern in the patterned mask layer defines the device region of the substrate. In some embodiments, a depth of the trench is greater than or equal to a depth of a buried layer, such as NBL 30 and/or NBL 230. In some embodiments, the depth of the trench is equal to a depth of a bottom surface of the buried layer. In some embodiments, the depth of the trench is less than a thickness of the substrate. In the depicted embodiment, the trench isolation structure is a DTI. However, the present disclosure contemplates that the trench isolation structure can be a DTI, an STI, a local oxidation of silicon (LOCOS) structure, other suitable isolation structure, or combinations thereof.

Turning to FIG. 12B, trench isolation connectors are formed in the trench isolation structures, such as trench isolation connectors 85 (including conductive vias 86 and conductive pads 88) in DTI structure 20 of device 10 and trench isolation connectors 285 (including conductive vias 286 and conductive pads 288) in DTI structure 220 of device 200. Forming a trench isolation connector can include forming a patterned mask layer over a substrate that exposes a trench isolation structure, etching the trench isolation structure to form a trench therein using the patterned mask layer as an etch mask, depositing an electrically conductive material (e.g., metal) in the trench, and removing the patterned mask layer. A conductive via and a conductive pad of the trench isolation connector can be formed by the same deposition process or different deposition processes, the same etching process or different etching processes, the same patterning process or different patterning process, or combinations thereof. In some embodiments, forming the conductive pad includes depositing the electrically conductive material in an opening of the patterned mask layer that exposes the trench isolation connector and/or an opening in a material layer deposited before forming the patterned mask layer.

Figures 12C, 12D:
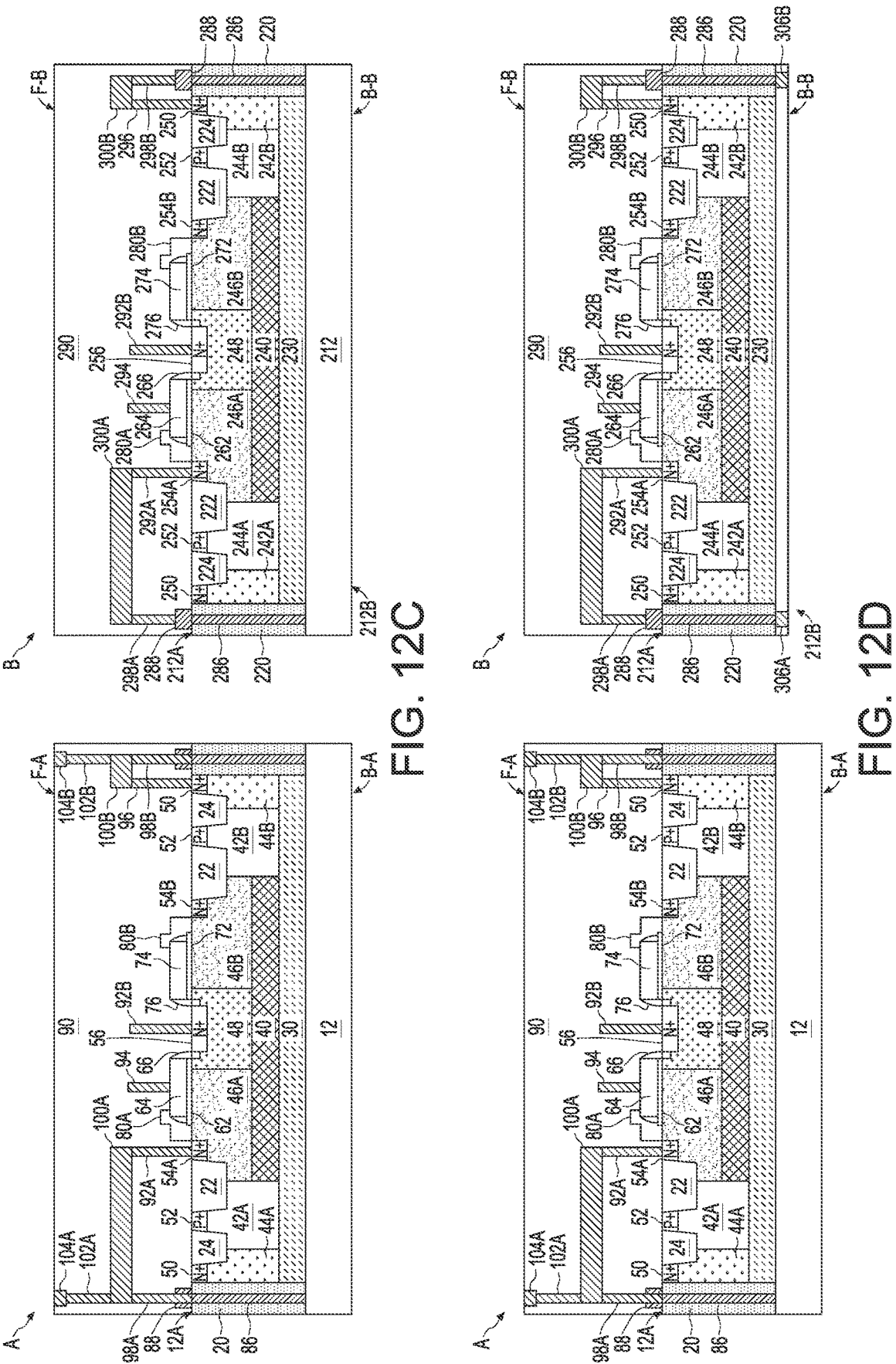

Turning to FIG. 12C, wafer A and wafer B undergo BEOL processing, which includes forming multilayer interconnect MLI of device 10 and/or wafer A and forming multilayer interconnect MLI of device 200 and/or wafer B.

Turning to FIG. 12D, a thinning process is performed on wafer B. For example, the thinning process reduces a thickness of substrate 212 (for example, from thickness T1 to thickness T3) and exposes trench isolation connectors 285, such that DTI structure 220 and/or trench isolation connectors 285 extend entirely through substrate 212. For example, DTI structure 220 and/or trench isolation connectors 285 extend from surface 212A (e.g., frontside) to surface 212B (e.g., backside) of substrate 212 after the thinning process. The thinning process reduces a thickness of substrate 212 along the z-direction. The thinning process is a grinding process, a planarization process (e.g., CMP), an etching process, other suitable process, or combinations thereof. In some embodiments, the thinning process is a CMP applied to backside B-B of wafer B (i.e., a backside CMP). In some embodiments, wafer B is attached to carrier wafer (substrate) before performing the thinning process. For example, insulation layer 290 and/or a patterned metal layer in insulation layer 290 may be bonded to a carrier wafer.

In some embodiments, bonding pads, such as a bonding pad 306A and a bonding pad 306B, of wafer B may be formed over trench isolation connectors 285. Bonding pad 306A and bonding pad 306B are physically and/or electrically connected to respective trench isolation connectors 285. Bonding pad 306A and bonding pad 306B may be disposed in an insulation layer, similar to insulation layer 290 and/or insulation layer 90. In some embodiments, conductive vias 286 of wafer B are formed after the thinning process.

Figure 12E:
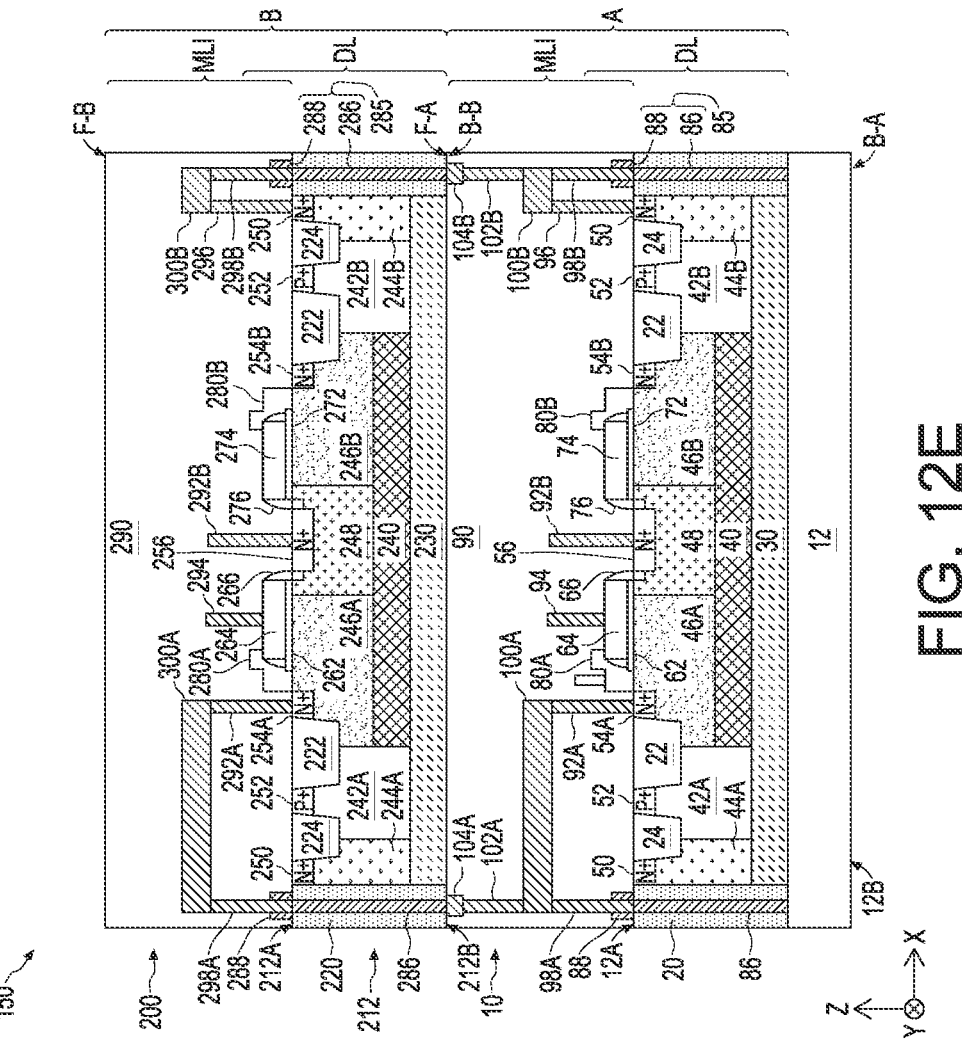

Turning to FIG. 12E, frontside F-A of wafer A is attached and/or bonded to backside B-B of wafer B. In such embodiments, a BEOL structure (e.g., multilayer interconnect MLI) of wafer A can provide silicon-on-insulator (SOI) like isolation for device 10 of wafer A, such as SOI-like electrical isolation from device 200 of wafer B. Wafer A and wafer B may be attached by dielectric-to-dielectric bonding (e.g., oxide-to-oxide bonding), metal-to-metal bonding (e.g., copper-to-copper bonding), metal-to-dielectric bonding (e.g., copper-to-oxide bonding), other type of bonding, or combinations thereof. For example, conductive line 104A and conductive line 104B of wafer A are attached and/or bonded to trench isolation connectors 286 of wafer B directly or via bonding pad 306A and bonding pad 306B, respectively, of wafer B.

Figures 13A, 13B:
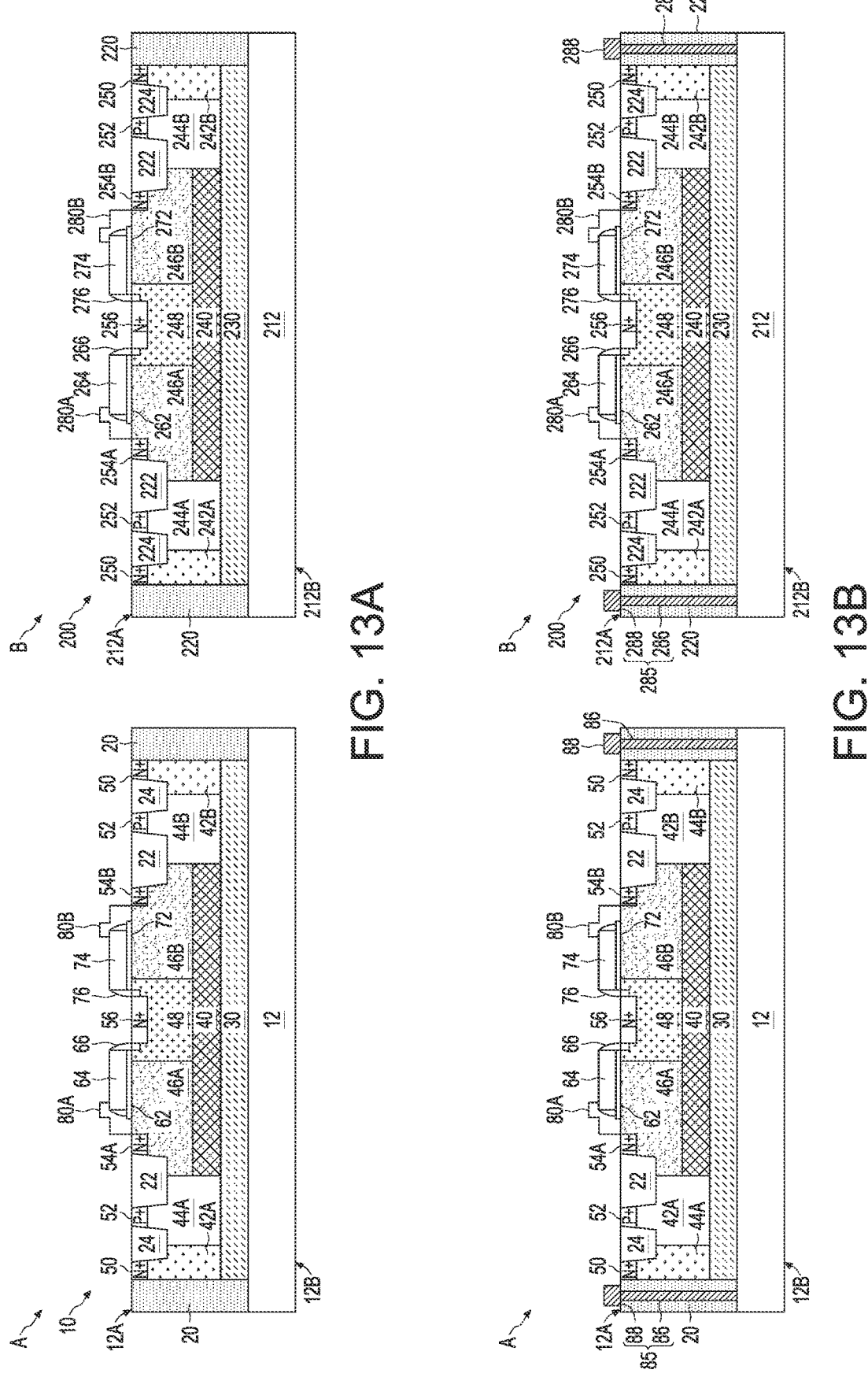
FIGS. 13A-13E are fragmentary diagrammatic cross-sectional views of the stacked device structure of FIG. 6, in portion or entirety, at various stages of fabrication thereof according to various aspects of the present disclosure.
Figures 13C, 13D:
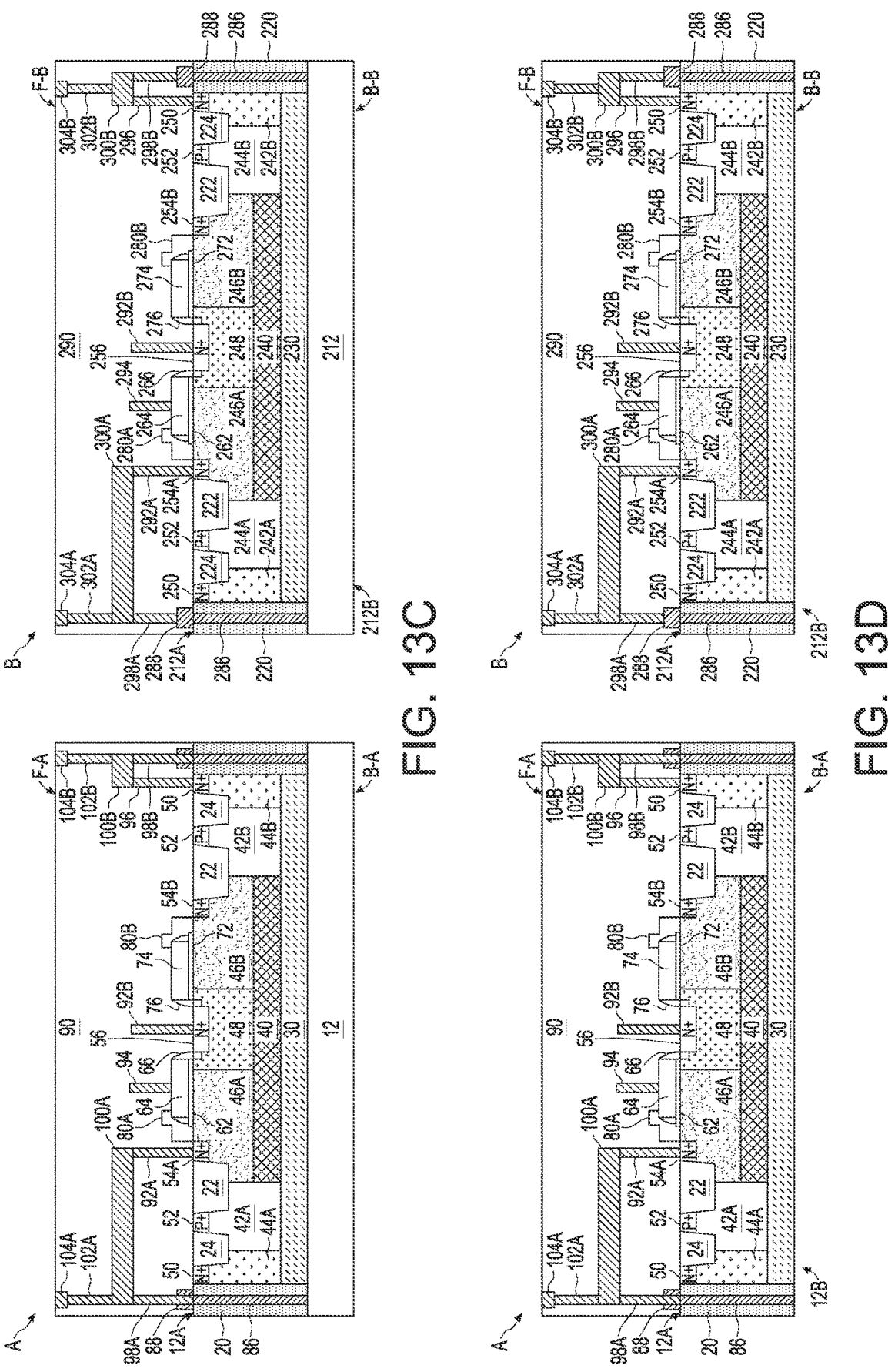
Figure 13E:
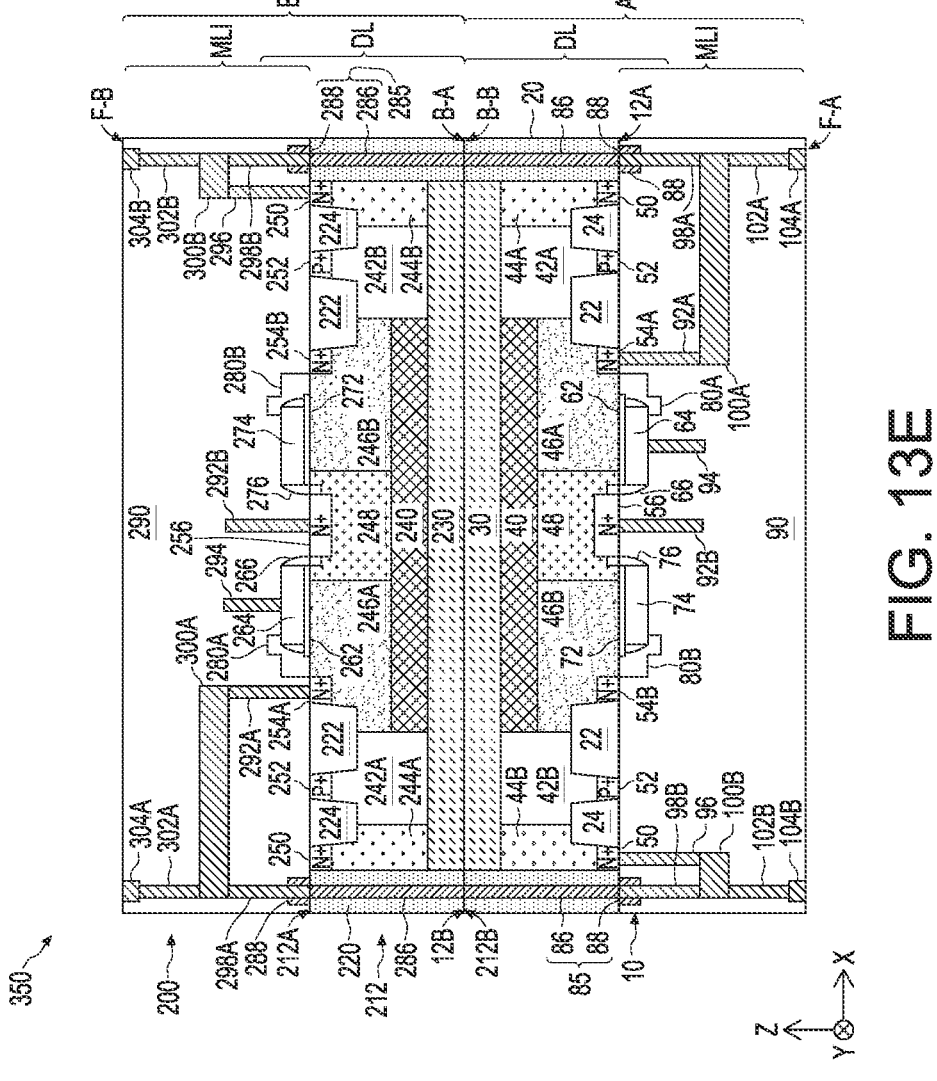

FIGS. 13A-13E are fragmentary diagrammatic cross-sectional views of stacked device structure 350 of FIG. 6, in portion or entirety, at various stages of fabrication thereof according to various aspects of the present disclosure. As described above, stacked device structure 350 includes wafer A and wafer B, where wafer A's backside is attached and/or bonded to wafer B's backside and wafer A and wafer B are electrically connected to each other using trench isolation connectors. Fabrication of stacked device structure 350 is similar to fabrication of stacked device structure 150 in FIGS. 12A-12E. For example, fabrication includes performing FEOL processing on wafer A and wafer B, including forming trench isolation structures of wafer A and wafer B (FIG. 13A), forming trench isolation connectors in the trench isolation structures (FIG. 13B), performing BEOL processing on wafer A and wafer B (FIG. 13C), performing a thinning process on wafer B (FIG. 13D), and attaching and/or bonding wafer A and wafer B (FIG. 13E). In FIG. 13D, a thinning process is also performed on wafer A, for example, to reduce a thickness of substrate 12 (for example, from thickness T1 to thickness T3) and exposes trench isolation connectors 85, such that DTI structure 20 and/or trench isolation connectors 85 disposed therein extend entirely through substrate 12. In FIG. 13E, wafer A's backside B-A is attached and/or bonded directly to wafer B's backside B-B. For example, trench isolation connectors 85 of wafer A are physically and/or electrically connected to trench isolation connectors 285 of wafer B. Wafer A and wafer B may be attached by dielectric-to-dielectric bonding, metal-to-metal bonding, metal-to-dielectric bonding, other type of bonding, or combinations thereof. FIGS. 13A-13E have been simplified for the sake of clarity to better understand the inventive concepts of the present disclosure. Additional features can be added in stacked device structure 350, and some of the features described below can be replaced, modified, or eliminated in other embodiments of stacked device structure 350. Additional steps can be provided before, during, and after fabrication of stacked device structure 350 and some of the steps described can be moved, replaced, or eliminated for additional embodiments of stacked device structure 350.

Figures 14A, 14B:
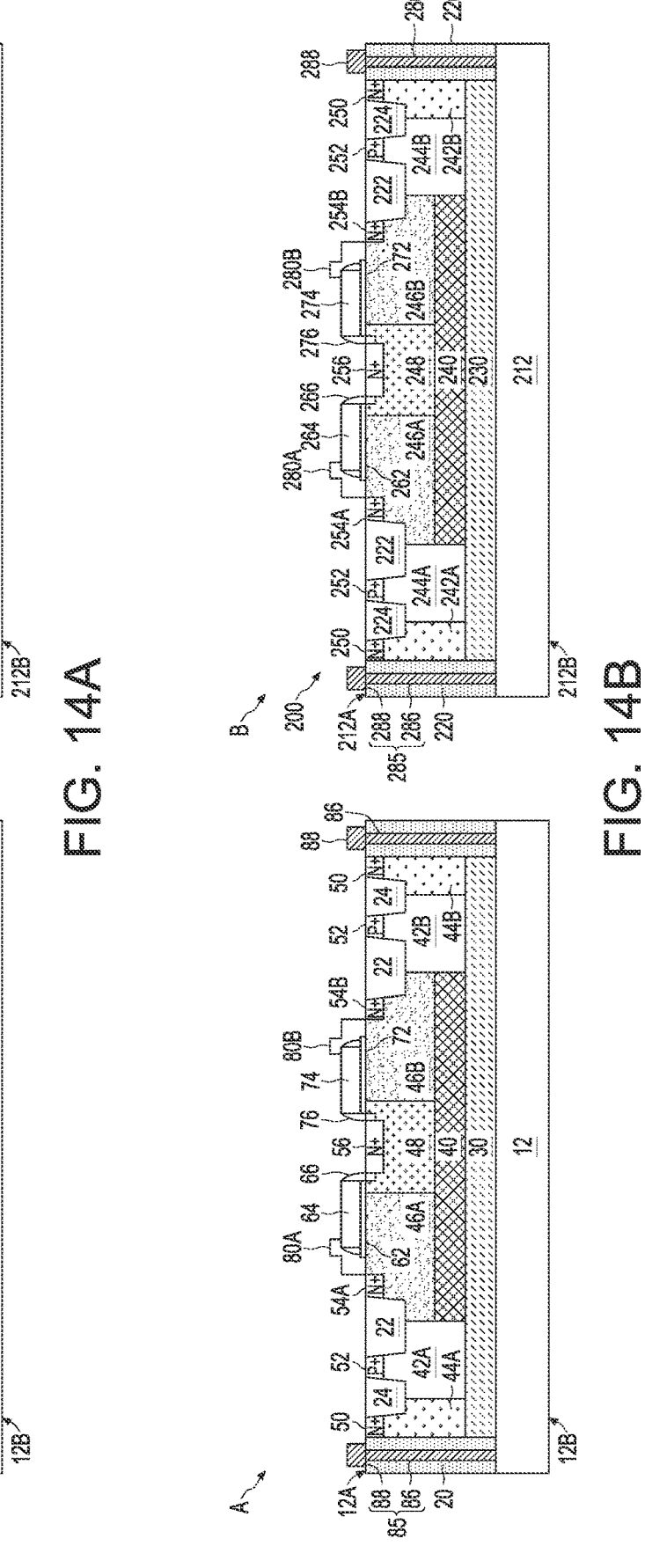
FIGS. 14A-14E are fragmentary diagrammatic cross-sectional views of the stacked device structure of FIG. 7, in portion or entirety, at various stages of fabrication thereof according to various aspects of the present disclosure.
Figures 14C, 14D:
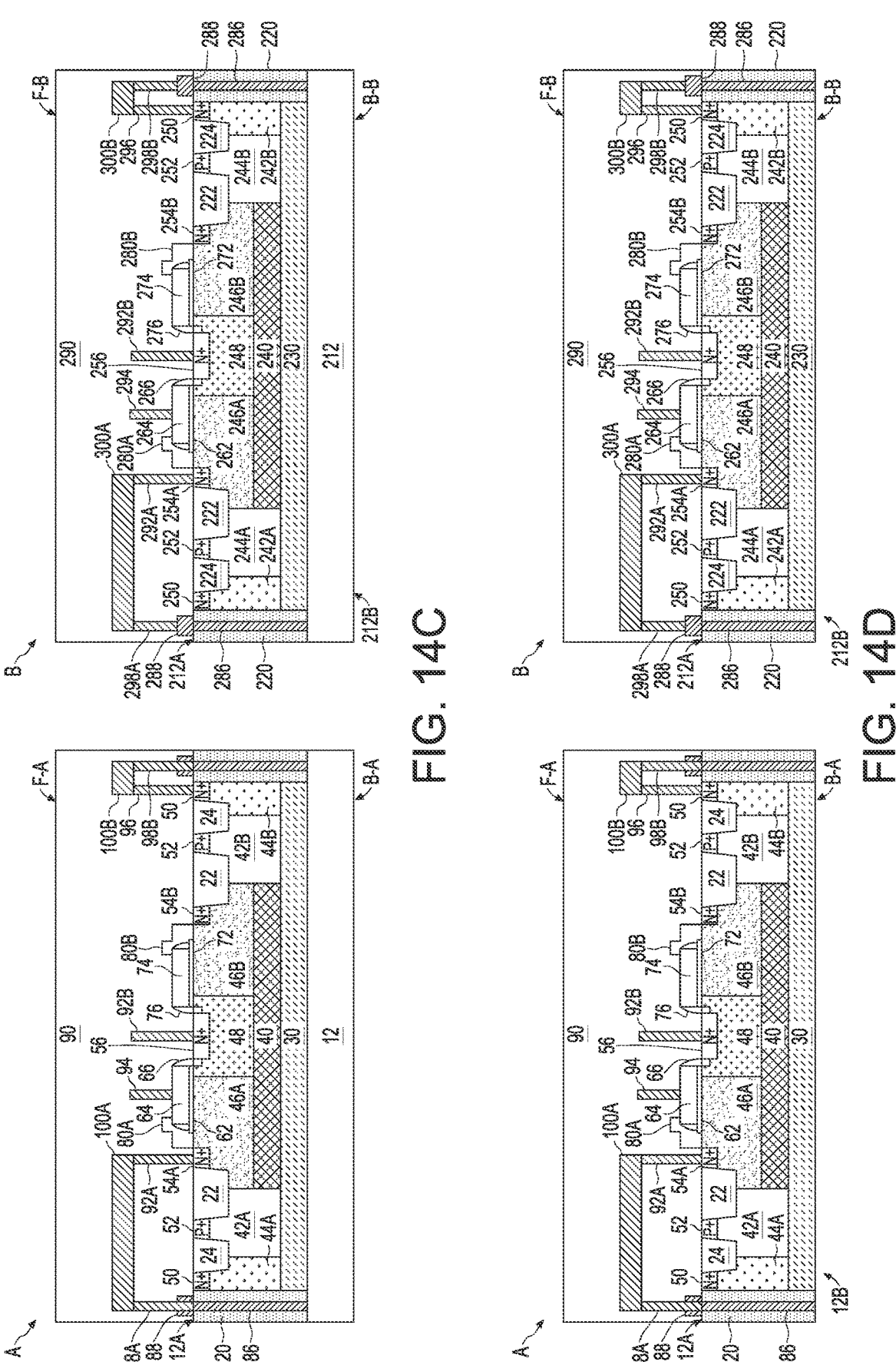
Figure 14E:
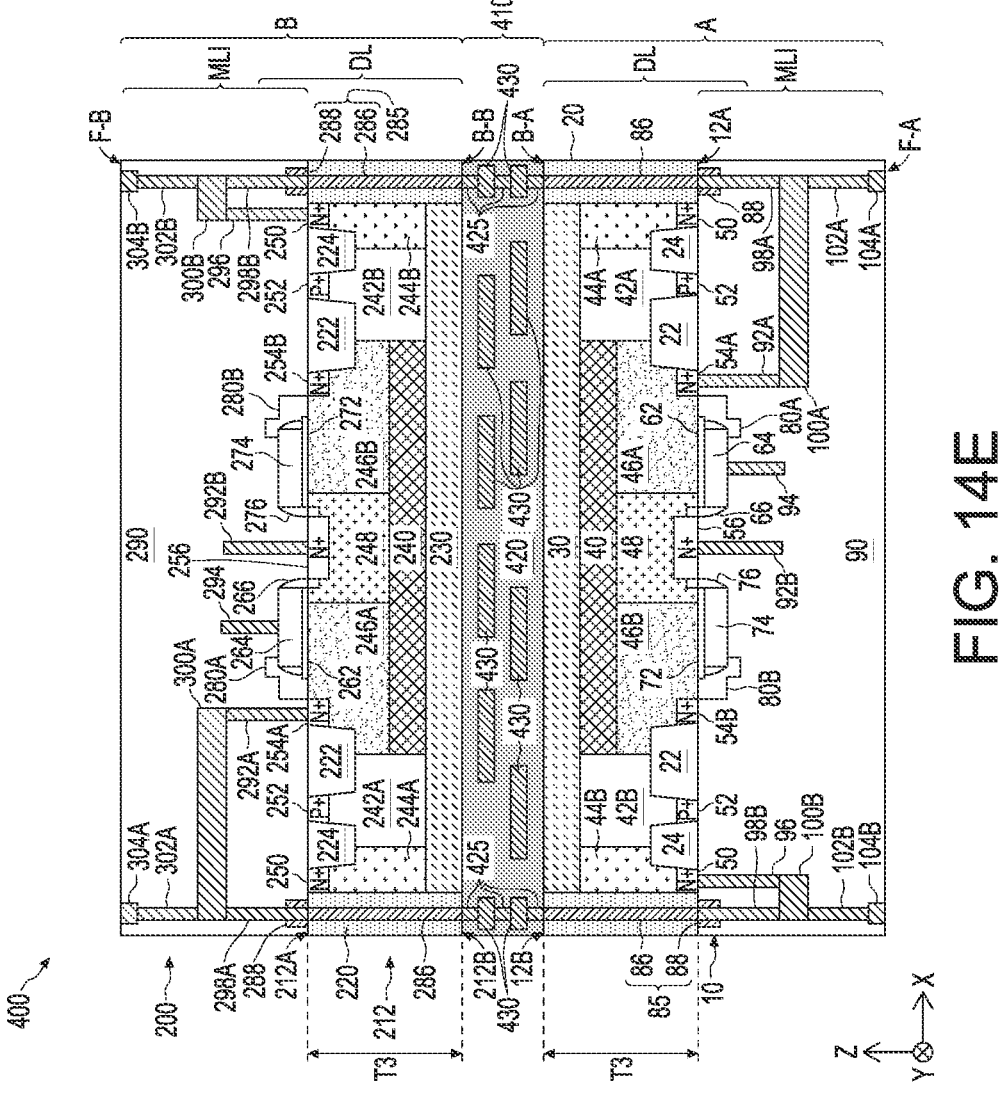

FIGS. 14A-14E are fragmentary diagrammatic cross-sectional views of stacked device structure 400 of FIG. 7, in portion or entirety, at various stages of fabrication thereof according to various aspects of the present disclosure. As described above, stacked device structure 400 includes wafer A and wafer B, where wafer A's backside is attached and/or bonded to wafer B's backside and wafer A and wafer B are electrically connected to each other using trench isolation connectors. Fabrication of stacked device structure 400 is similar to fabrication of stacked device structure 150 in FIGS. 12A-12E. For example, fabrication includes performing FEOL processing on wafer A and wafer B, including forming trench isolation structures of wafer A and wafer B (FIG. 14A), forming trench isolation connectors in the trench isolation structures (FIG. 14B), performing BEOL processing on wafer A and wafer B (FIG. 14C), performing a thinning process on wafer B (FIG. 14D), and attaching and/or bonding wafer A and wafer B (FIG. 14E). In FIG. 14D, a thinning process is also performed on wafer A, for example, to reduce a thickness of substrate 12 (for example, from thickness T1 to thickness T3) and exposes DTI structure 20, such that DTI structure 20 and/or trench isolation connectors 85 extend entirely through substrate 12. In FIG. 14E, bonding layer 410 is formed on wafer A's backside B-A, wafer B's backside B-B, or a combination thereof, and then wafer A's backside B-A is attached and/or bonded to wafer B's backside B-B. For example, bonding layer 410 is formed on surface 12B of wafer A and bonding layer 410 is attached and/or bonded to surface 212B of wafer B, or vice versa. FIGS. 14A-14E have been simplified for the sake of clarity to better understand the inventive concepts of the present disclosure. Additional features can be added in stacked device structure 400, and some of the features described below can be replaced, modified, or eliminated in other embodiments of stacked device structure 400. Additional steps can be provided before, during, and after fabrication of stacked device structure 400 and some of the steps described can be moved, replaced, or eliminated for additional embodiments of stacked device structure 400.

Figures 15A, 15B:
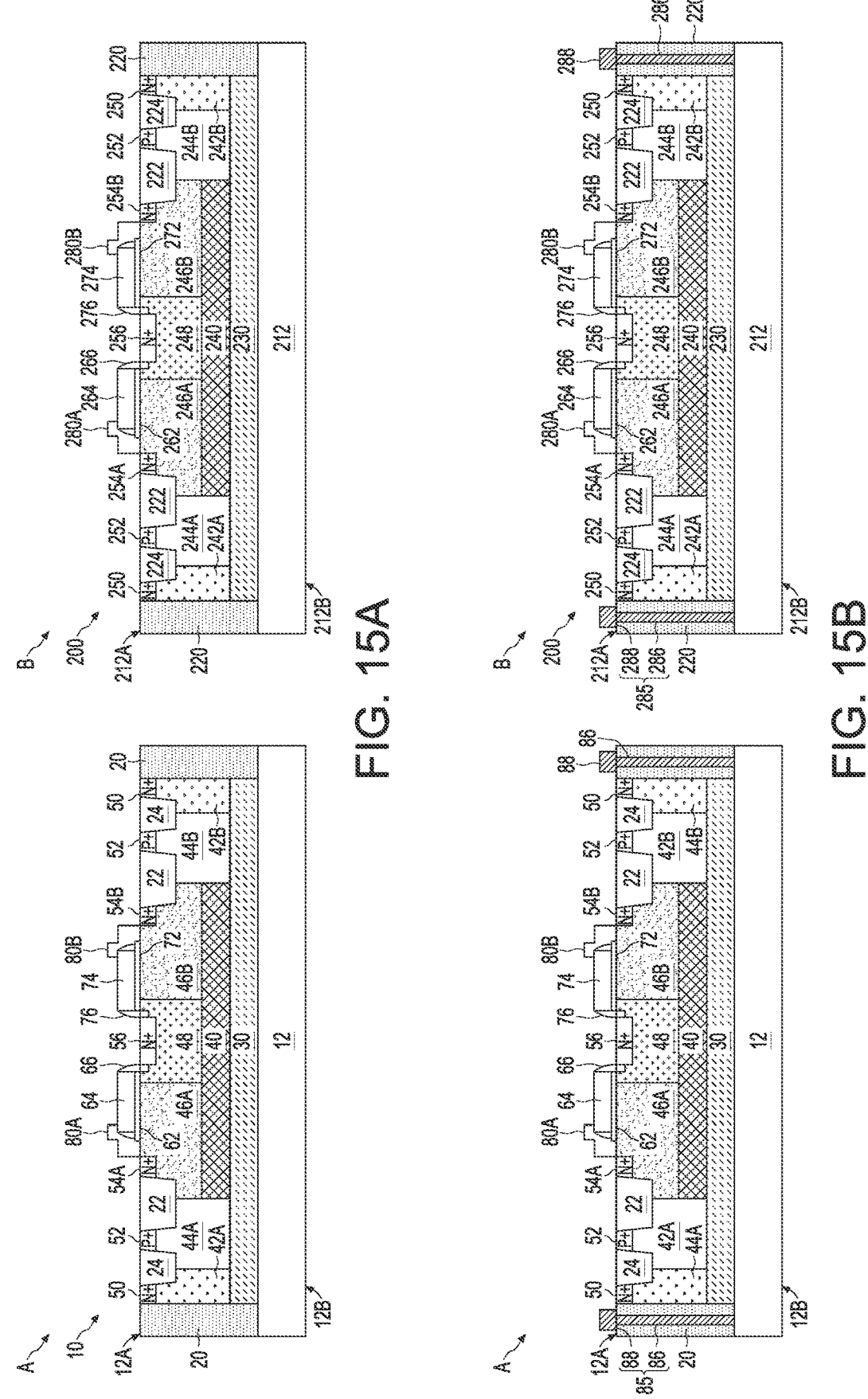
FIGS. 15A-15E are fragmentary diagrammatic cross-sectional views of stacked device structure of FIG. 8, in portion or entirety, at various stages of fabrication thereof according to various aspects of the present disclosure.
Figures 15C, 15D:
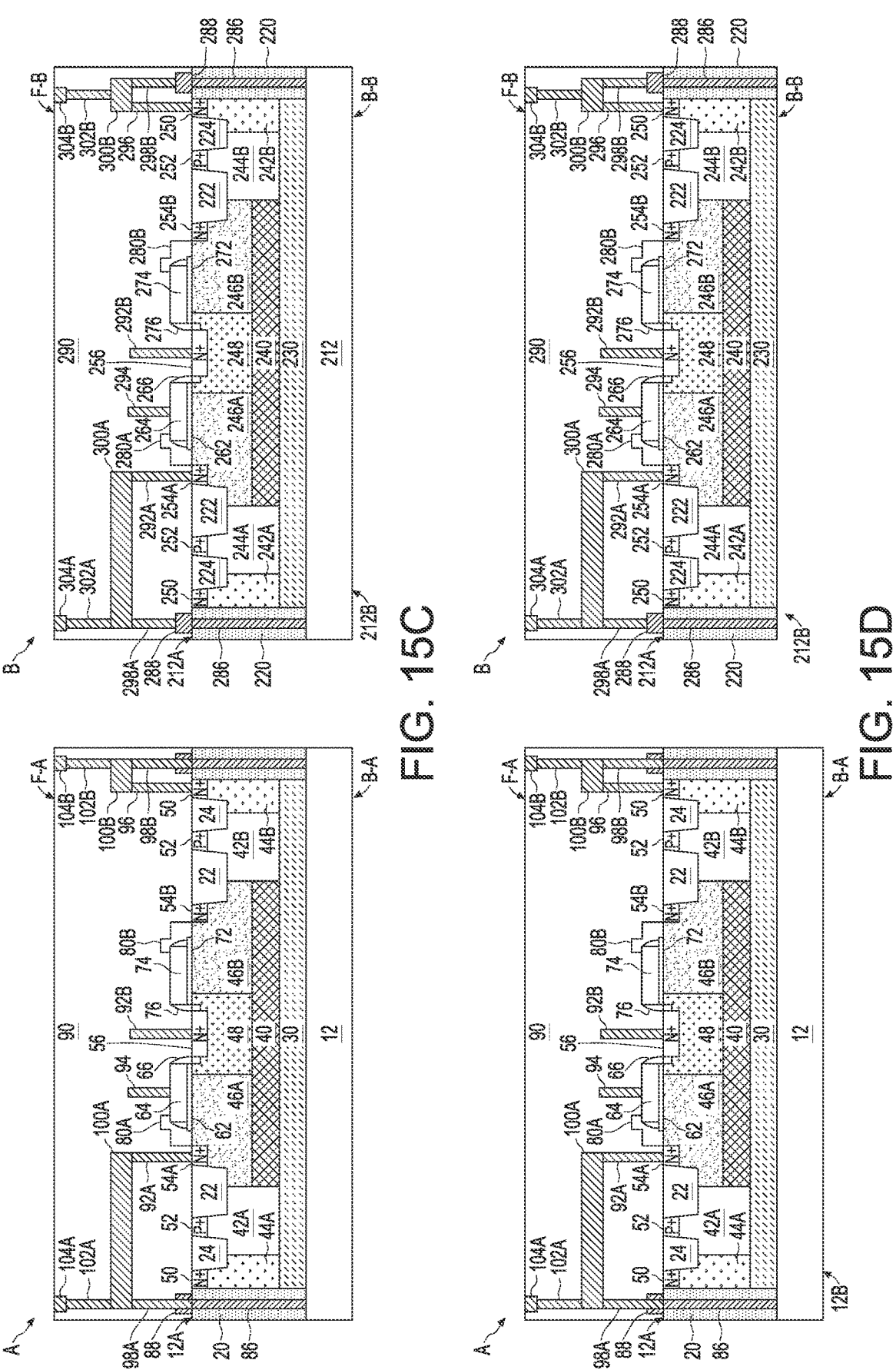
Figure 15E:
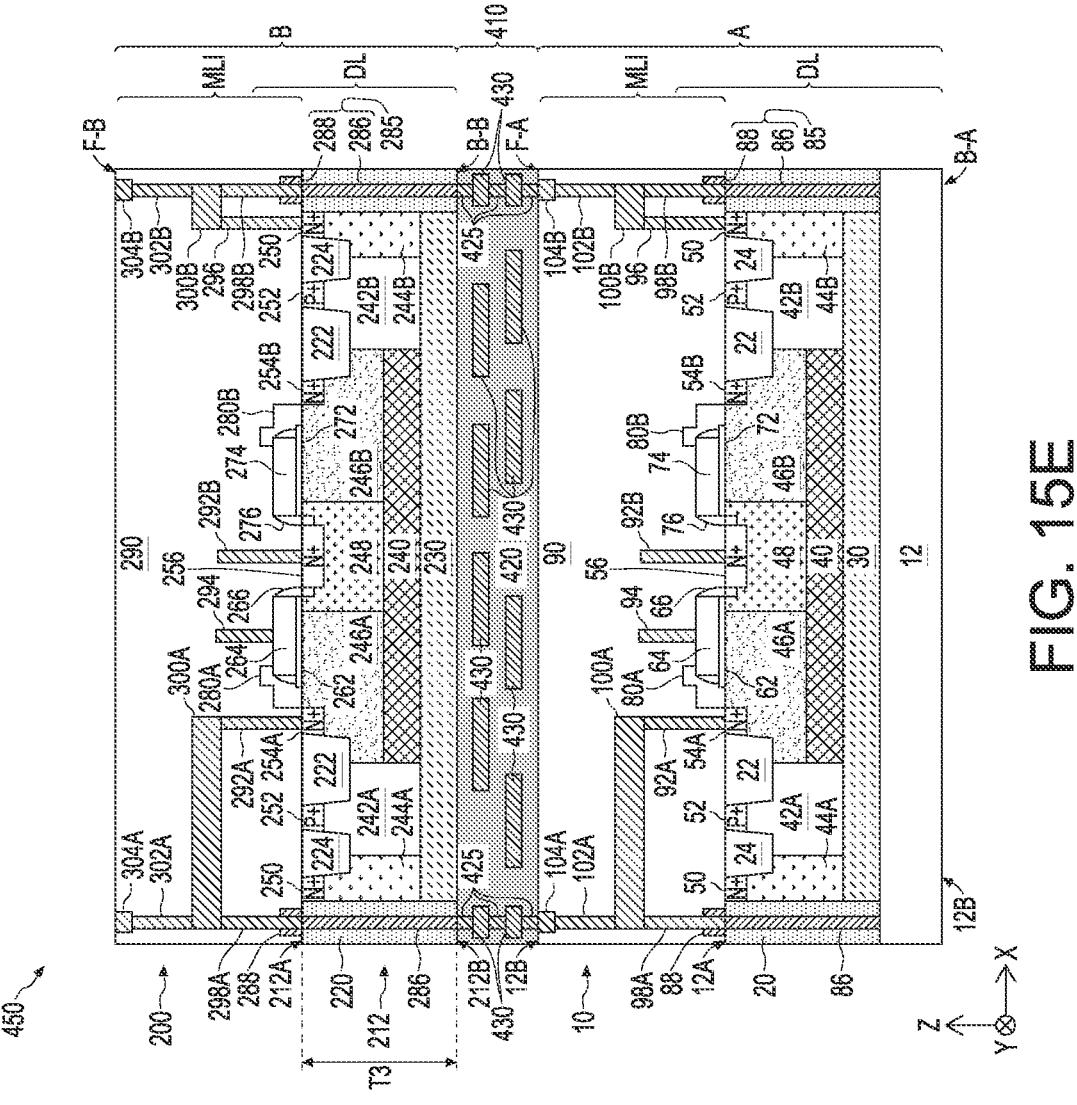

FIGS. 15A-15E are fragmentary diagrammatic cross-sectional views of stacked device structure 450 of FIG. 8, in portion or entirety, at various stages of fabrication thereof according to various aspects of the present disclosure. As described above, stacked device structure 450 includes wafer A and wafer B, where wafer A's frontside is attached and/or bonded to wafer B's backside and wafer A and wafer B are electrically connected to each other using trench isolation connectors. Fabrication of stacked device structure 450 is similar to fabrication of stacked device structure 150 in FIGS. 12A-12E. For example, fabrication includes performing FEOL processing on wafer A and wafer B, including forming trench isolation structures of wafer A and wafer B (FIG. 15A), forming trench isolation connectors in the trench isolation structures (FIG. 15B), performing BEOL processing on wafer A and wafer B (FIG. 15C), performing a thinning process on wafer B (FIG. 15D), and attaching and/or bonding wafer A and wafer B (FIG. 15E). In FIG. 15E, bonding layer 410 is formed on wafer A's frontside F-A, wafer B's backside B-B, or a combination thereof, and then wafer A's frontside F-A is attached and/or bonded to wafer B's backside B-B. For example, bonding layer 410 is formed on wafer A's multilayer interconnect MLI and bonding layer 410 is attached and/or bonded to surface 212B of wafer B, or vice versa. FIGS. 15A-15E have been simplified for the sake of clarity to better understand the inventive concepts of the present disclosure. Additional features can be added in stacked device structure 450, and some of the features described below can be replaced, modified, or eliminated in other embodiments of stacked device structure 450. Additional steps can be provided before, during, and after fabrication of stacked device structure 450 and some of the steps described can be moved, replaced, or eliminated for additional embodiments of stacked device structure 450.

Wafers, as described herein, may be processed wafers including device structures and/or semiconductor structures before or after singulation (i.e., where a processed wafer is divided into individual chips and/or dies). In some embodiments, wafer A and wafer B are wafers that have not undergone singulation, where wafer A (and/or devices thereof) and wafer B (and/or devices thereof) are physically and/or electrically connected before singulation. In such embodiments, stacked device structures described herein are un-singulated wafer stacks, which may be subsequently subjected to a singulation process, such as a dicing process. The dicing process may be performed by sawing operations and/or scribing operations, such as mechanical sawing, laser sawing, patterned etching, scribing followed by mechanical breaking, other dicing methods, or combinations thereof. In some embodiments, the singulation process includes separating stacked dies and/or stacked devices of the stacked wafers, such as the stacked device structures disclosed herein, from one another by cutting the stacked wafers along scribe lines, thereby providing individual, separate stacked dies and/or stacked devices. After the singulation process, the resulting separated stacked dies and/or stacked devices can be separately sold, shipped, packaged, integrated individually into other packages, or combinations thereof. In some embodiments, stacked device structures described herein can be singulated into separate stacked dies and/or stacked devices that are electrically connected by trench isolation connectors.

In some embodiments, wafer A and wafer B are wafers after a singulation process, where wafer A and wafer B are devices, chips, dies, packages, etc. that are physically and/or electrically connected after singulation. In such embodiments, stacked device structures described herein are device stacks, chip stacks, die stacks, package stacks, etc. For example, wafer A may be a first device, wafer B may be a second device, and the first device is electrically connected to the second device by a trench isolation connector, such as described herein. In another example, wafer A may be a first chip, wafer B may be a second chip, the first chip (and/or a first device thereof) is electrically connected to the second chip (and/or a second device thereof) by a trench isolation connector, such as described herein. In another example, wafer A may be a first IC package, wafer B may be a second IC package, and the first IC package (and/or a first device thereof) is electrically connected to the second IC package (and/or a second device thereof) by a trench isolation connector, such as described herein. In yet another example, wafer A may be a first chip stack, wafer B may be a second chip stack, and the first chip stack (and/or a first device thereof) is electrically connected to the second chip stack (and/or a second device thereof) by a trench isolation connector, such as described herein.

Trench isolation connectors are disclosed herein that electrically connect stacked structures, such as wafers, IC chips, IC dies, substrates, devices thereof, or combinations thereof. The present disclosure provides for many different embodiments. An exemplary stacked device arrangement includes a first device substrate having a first device and a second device substrate having a first surface opposite a second surface. The second device substrate has a second device at the first surface of the second device substrate. The stacked device arrangement further includes an isolation structure disposed in the second device substrate and surrounding the second device. The isolation structure extends through the second device substrate from the first surface of the second device substrate to the second surface of the second device substrate. The stacked device arrangement further includes a conductive connector disposed in the isolation structure. The conductive connector is connected to the second device, the conductive connector is connected to the first device, and the conductive connector extends from the first surface of the second device substrate to the second surface of the second device substrate. In some embodiments, the first device and the second device are high voltage devices.

In some embodiments, a first chip includes the first device substrate and a first multilayer interconnect (MLI) disposed over the first device substrate and a second chip includes the second device substrate and a second MLI disposed over the second device substrate. The first MLI is connected to the first device and the second MLI is connected to the second device. The first MLI provides a frontside of the first chip and the first device substrate provides a backside of the first chip. The second MLI provides a frontside of the second chip and the second surface of the second device substrate provides a backside of the second chip. In some embodiments, the backside of the second chip is attached to the frontside of the first chip, and the conductive connector is connected to the first MLI and the second MLI. In some embodiments, the backside of the second chip is attached to the frontside of the first chip by a bonding layer, an interconnect structure of the bonding layer is connected to the conductive connector and the first MLI, and the conductive connector is connected to the second MLI.

In some embodiments, the isolation structure is a first isolation structure and the conductive connector is a first conductive connector. In such embodiments, the stacked device arrangement can further include a second isolation structure disposed in the first device substrate. The second isolation structure surrounds the first device, and the second isolation structure extends through the first device substrate from a first surface of the first device substrate to a second surface of the first device substrate. The stacked device arrangement can further include a second conductive connector disposed in the second isolation structure. The second conductive connector is connected to the first device, the second conductive connector is connected to the second device, and the second conductive connector extends from the first surface of the first device substrate to the second surface of the first device substrate.

In some embodiments, the backside of the second chip is attached to the backside of the first chip, and the first conductive connector is connected to the second conductive connector. In some embodiments, the backside of the second chip is attached to the backside of the first chip by a bonding layer, and an interconnect structure of the bonding layer is connected to the first conductive connector and the second conductive connector.

An exemplary device stack includes a first device over a second device. The first device is formed by a first back-end-of-line (BEOL) structure over a first device layer. The second device is formed by a second BEOL structure over a second device layer. A trench isolation connector connects the first device to the second device. The trench isolation connector is a portion of the first device layer, the trench isolation connector includes a conductive via disposed in an isolation structure, and the trench isolation connector is a backside interconnect of the first device. In some embodiments, the isolation structure is a deep trench isolation structure disposed in a substrate of the first device layer. In some embodiments, the trench isolation connector connects a frontside of the first device to a frontside of the second device. In some embodiments, the first device and the second device are high voltage transistors. In some embodiments, the device stack includes a bonding layer that attaches the first device layer and the second BEOL structure, and the trench isolation connector is connected to the bonding layer.

In some embodiments, the trench isolation connector is a first trench isolation connector, the backside interconnect is a first backside interconnect, and the conductive via is a first conductive via. In such embodiments, the device stack can further include a third device formed by the first device layer and the first BEOL structure and a second trench isolation connector that connects the third device to the second device. The second trench isolation connector is a portion of the first device layer, the second trench isolation connector includes a second conductive via disposed in the isolation structure, and the second trench isolation connector is a second backside interconnect of the third device.

The first BEOL structure may connect a gate of the first device to the first trench isolation connector and a gate of the third device to the second trench isolation connector. The second BEOL structure may connect the first trench isolation connector and the second trench isolation connector. In some embodiments, the gate of the first device is a first gate of the first device and the gate of the third device is a first gate of the third device. The first BEOL structure may connect the first gate of the first device to a second gate of the first device. The first BEOL structure may connect the first gate of the third device to a second gate of the third device.

An exemplary method for forming a wafer-on-wafer stack includes performing front-end-of-line processing on a first wafer and a second wafer. The first wafer includes a first trench isolation structure disposed in a first substrate, the second wafer includes a second trench isolation structure disposed in a second substrate, the first trench isolation structure surrounds a first device of the first wafer, and the second trench isolation structure surrounds a second device of the second wafer. The method further includes forming a first trench isolation connector in the first trench isolation structure and a second trench isolation connector in the second trench isolation structure. The first trench isolation connector is connected to the first device and the second trench isolation connector is connected to the second device. The method further includes attaching the first wafer to the second wafer. The second trench isolation connector is connected to the first device and the second device. In some embodiments, the first device is a first high voltage transistor and the second device is a second high voltage transistor. In some embodiments, the method includes performing a thinning process on the second wafer. In some embodiments, the method includes directly attaching the first wafer to the second wafer.

In some embodiments, the method includes singulating the first wafer and the second wafer. In some embodiments, the first wafer and the second wafer are singluated before forming the first trench isolation connector and the second trench isolation connector, respectively. In some embodiments, the first wafer and the second wafer are singluated after forming the first trench isolation connector and the second trench isolation connector, respectively. In some embodiments, the first wafer and the second wafer are singluated after attaching the first wafer to the second wafer, such that a singulation process is performed on a stacked wafer structure. In some embodiments, the first wafer and the second wafer are singluated before attaching the first wafer to the second wafer, such that the first wafer and the second wafer are individual devices, chips, etc. that are subsequently attached and/or electrically connected to one another.

An exemplary wafer-on-wafer stack includes a first wafer attached to a second wafer. The first wafer has a first back-end-of-line (BEOL) structure disposed over a first device layer, the second wafer has a second BEOL structure disposed over a second device layer, a first device is formed from the first device layer and the first BEOL structure, and a second device is formed from the second device layer and the second BEOL structure. The wafer-on-wafer stack further includes a trench isolation connector that connects the first device of the first wafer to the second wafer. The trench isolation connector is a portion of the first device layer of the first wafer, the trench isolation connector includes a conductive via disposed in an isolation structure, and the trench isolation connector is a backside interconnect of the first wafer.

In some embodiments, the isolation structure is a deep trench isolation structure disposed in a substrate of the first device layer. In some embodiments, the trench isolation connector connects the first device of the first wafer to the second device of the second wafer. In some embodiments, the wafer-on-wafer stack includes a bonding wafer that attaches the first wafer and the second wafer and the trench isolation connector is connected to the bonding wafer. In some embodiments, first device and the second device are high voltage transistors.

In some embodiments, the trench isolation connector is a first trench isolation connector, the backside interconnect is a first backside interconnect, and the conductive via is a first conductive via. In such embodiments, the wafer-on-wafer stack can further include a third device formed from the first device layer and the first BEOL structure and a second trench isolation connector that connects the third device of the first wafer to the second wafer. The second trench isolation connector is a portion of the first device layer of the first wafer, the second trench isolation connector includes a second conductive via disposed in the isolation structure, and the second trench isolation connector is a second backside interconnect of the first wafer. The first BEOL structure can connect a first gate of the first device to the first trench isolation connector and a first gate of the third device to the second trench isolation connector. The second BEOL structure can connect the first trench isolation connector and the second trench isolation connector. In some embodiments, the first BEOL structure can connect the first gate of the first device to a second gate of the first device and the first BEOL structure can connect the first gate of the third device to a second gate of the third device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A stacked device arrangement comprising:
a first device substrate having a first device;
a second device substrate having a first surface opposite a second surface, wherein the second device substrate has a second device at the first surface of the second device substrate,
an isolation structure disposed in the second device substrate, wherein the isolation structure and the second device substrate have a same thickness, such that the isolation structure extends through the second device substrate from the first surface of the second device substrate to the second surface of the second device substrate, and further wherein, in a top view, the isolation structure surrounds the second device; and
a conductive connector disposed in the isolation structure, wherein the conductive connector is connected to the second device, the conductive connector is connected to the first device, and the conductive connector extends from the first surface of the second device substrate to the second surface of the second device substrate.

2. The stacked device arrangement of claim 1, wherein the first device is a first high voltage device and the second device is a second high voltage device.

3. The stacked device arrangement of claim 1, further comprising:
a first chip that includes the first device substrate, wherein the first chip further includes a first multilayer interconnect (MLI) disposed over the first device substrate, wherein the first MLI is connected to the first device; and
a second chip that includes the second device substrate, wherein the second chip further includes a second MLI disposed over the second device substrate, wherein the second MLI is connected to the second device.

4. The stacked device arrangement of claim 3, wherein:
the first MLI provides a frontside of the first chip and the first device substrate provides a backside of the first chip;
the second MLI provides a frontside of the second chip and the second surface of the second device substrate provides a backside of the second chip; and
the backside of the second chip is attached to the frontside of the first chip and the conductive connector is connected to the first MLI and the second MLI.

5. The stacked device arrangement of claim 3, wherein:
the first MLI provides a frontside of the first chip and the first device substrate provides a backside of the first chip;
the second MLI provides a frontside of the second chip and the second surface of the second device substrate provides a backside of the second chip; and the backside of the second chip is attached to the frontside of the first chip by a bonding layer, an interconnect structure of the bonding layer is connected to the conductive connector and the first MLI, and the conductive connector is connected to the second MLI.

6. The stacked device arrangement of claim 3, wherein the isolation structure is a first isolation structure and the conductive connector is a first conductive connector, the stacked device arrangement further comprising:
a second isolation structure disposed in the first device substrate, the second isolation structure surrounds the first device, and the second isolation structure extends through the first device substrate from a first surface of the first device substrate to a second surface of the first device substrate; and
a second conductive connector disposed in the second isolation structure, wherein the second conductive connector is connected to the first device, the second conductive connector is connected to the second device, and the second conductive connector extends from the first surface of the first device substrate to the second surface of the first device substrate.

7. The stacked device arrangement of claim 6, wherein:
the first MLI provides a frontside of the first chip and the second surface of the first device substrate provides a backside of the first chip;
the second MLI provides a frontside of the second chip and the second surface of the second device substrate provides a backside of the second chip; and
the backside of the second chip is attached to the backside of the first chip and the first conductive connector is connected to the second conductive connector.

8. The stacked device arrangement of claim 6, wherein:
the first MLI provides a frontside of the first chip and the second surface of the first device substrate provides a backside of the first chip;
the second MLI provides a frontside of the second chip and the second surface of the second device substrate provides a backside of the second chip; and
the backside of the second chip is attached to the backside of the first chip by a bonding layer and an interconnect structure of the bonding layer is connected to the first conductive connector and the second conductive connector.

9. A device stack comprising:
a first device over a second device, wherein the first device is formed by a first back-end-of-line (BEOL) structure over a first device layer and the second device is formed by a second BEOL structure over a second device layer; and
a trench isolation connector that connects the first device to the second device, wherein the trench isolation connector is a portion of the first device layer, the trench isolation connector has a first thickness that is equal to a second thickness of a semiconductor substrate of the first device layer, the trench isolation connector includes a conductive via disposed in an isolation structure, and the trench isolation connector is a backside interconnect of the first device.

10. The device stack of claim 9, wherein the isolation structure is a deep trench isolation structure disposed in the semiconductor-a substrate of the first device layer.

11. The device stack of claim 9, wherein the trench isolation connector connects a frontside of the first device to a frontside of the second device.

12. The device stack of claim 9, the trench isolation connector is a first trench isolation connector, the backside interconnect is a first backside interconnect, and the conductive via is a first conductive via, the device stack further comprising:

a third device formed by the first device layer and the first BEOL structure;

a second trench isolation connector that connects the third device to the second device, wherein the second trench isolation connector is a portion of the first device layer, the second trench isolation connector includes a second conductive via disposed in the isolation structure, and the second trench isolation connector is a second backside interconnect of the third device;

the first BEOL structure connects a gate of the first device to the first trench isolation connector and a gate of the third device to the second trench isolation connector; and the second BEOL structure connects the first trench isolation connector and the second trench isolation connector.

13. The device stack of claim 12, wherein the gate of the first device is a first gate of the first device and the gate of the third device is a first gate of the third device, the first BEOL structure connects the first gate of the first device to a second gate of the first device, and the first BEOL structure connects the first gate of the third device to a second gate of the third device.

14. The device stack of claim 9, further comprising a bonding layer that attaches the first device layer and the second BEOL structure, wherein the trench isolation connector is connected to the bonding layer.

15. The device stack of claim 9, wherein the first device is a first high voltage transistor and the second device is a second high voltage transistor.

16. A method for forming a wafer-on-wafer stack comprising:

performing front-end-of-line processing on a first wafer and a second wafer, wherein the first wafer includes a first trench isolation structure disposed in a first substrate, the second wafer includes a second trench isolation structure disposed in a second substrate, the first trench isolation structure surrounds a first device of the first wafer, and the second trench isolation structure surrounds a second device of the second wafer;

forming a first trench isolation connector in the first trench isolation structure and a second trench isolation connector in the second trench isolation structure;

after forming the first trench isolation connector and the second trench isolation connector, forming a first frontside interconnect that connects the first trench isolation structure to the first device and a second frontside interconnect that connects the second trench isolation connector to the second device; and after forming the second frontside interconnect and exposing a backside of the second trench isolation connector, attaching the first wafer to the second wafer, wherein the second trench isolation connector is connected to the first device and the second device.

17. The method for forming the wafer-on-wafer stack of claim 16, wherein the first device is a first high voltage transistor and the second device is a second high voltage transistor.

18. The method for forming the wafer-on-wafer stack of claim 16, wherein the exposing the backside of the second trench isolation connector includes performing a thinning process on the second wafer.

19. The method for forming the wafer-on-wafer stack of claim 16, further comprising directly attaching the first wafer to the second wafer.

20. The method for forming the wafer-on-wafer stack of claim 16, further comprising forming a bonding layer and attaching the first wafer to the second wafer via the bonding layer, wherein the second trench isolation connector is connected to the bonding layer.

* * * * *